United States Patent [19]
Wittekoek et al.

[11] Patent Number: 5,144,363
[45] Date of Patent: Sep. 1, 1992

[54] APPARATUS FOR AND METHOD OF PROJECTING A MASK PATTERN ON A SUBSTRATE

[75] Inventors: Stefan Wittekoek; Marinus A. Van Den Brink; Theodorus A. Fahner, all from Veldhoven, all of Netherlands

[73] Assignee: ASM Lithography B.V., Veldhoven, Netherlands

[21] Appl. No.: 645,158

[22] Filed: Jan. 24, 1991

[30] Foreign Application Priority Data

Mar. 5, 1990 [NL] Netherlands ............... 9000503

[51] Int. Cl.⁵ .................................. G03B 27/42
[52] U.S. Cl. .................................................. 355/53
[58] Field of Search ..................................... 355/53

[56] References Cited

U.S. PATENT DOCUMENTS

| | | | |
|---|---|---|---|
| 4,853,745 | 8/1989 | Kamiya et al. | 355/53 |
| 4,901,109 | 2/1990 | Mitome et al. | 355/53 |
| 4,952,970 | 8/1990 | Suzuki et al. | 355/53 |
| 4,958,082 | 9/1990 | Makinouchi et al. | 355/53 |

Primary Examiner—Monroe H. Hayes
Attorney, Agent, or Firm—John C. Fox

[57] ABSTRACT

A projection apparatus is described having a reference plate with a set of grating marks in X and Y directions for aligning with an exposure mask having similar marks, and having four detectors for each mark, and having a lens system for projecting only the relevant mark on the relevant detector. A method of projecting is also described in which the detection signals are simultaneously processed with other signals to result in a control signal to adjust image quality.

71 Claims, 10 Drawing Sheets

APPARATUS FOR AND METHOD OF PROJECTING A MASK PATTERN ON A SUBSTRATE

BACKGROUND OF THE INVENTION

The invention relates to a method of projecting a mask pattern provided in a mask table on a substrate provided in a substrate table by means of a projection lens system and a projection beam, which method comprises the following steps:

providing a mask having mask reference marks in the mask table, providing a reference plate having reference plate marks in the projection beam, projecting the image of at least one mark of the mask on a corresponding mark of the reference plate by means of the projection beam and the projection lens system, detecting projection radiation originating from the illuminated reference plate mark by means of radiation-sensitive image detection detectors, electronically processing the detector signals to an alignment calibration signal and a magnification error signal, adjusting an alignment device and setting the magnification of the projection lens system by means of the last-mentioned respective signals, removing the reference plate from the projection beam and providing a production substrate in the projection beam, and repetitively projecting a production mask successively in different positions on the production substrate.

The invention particularly also relates to an apparatus for projecting a mask pattern on a substrate, which apparatus successively comprises an illumination system for supplying a projection beam, a mask table, a projection lens system and a substrate table and which further comprises an alignment device and a magnification setting device used for aligning the mask and the substrate with respect to each other during the production projection process and for setting the magnification with which the mask pattern is imaged on the substrate, and an image detection device used for checking, prior to a production projection process, a mask image formed by means of the projection lens system and the projection beam, said image detection device comprising a reference plate having at least one mark on which the image of a corresponding mark of the mask is formed and a radiation-sensitive detection system for converting projection radiation originating from at least one reference plate mark into electric signals.

Such a method and device are described in U.S. Pat. No. 4,504,277 which relates to an apparatus for repetitive and reduced imaging of a mask pattern, for example, the pattern of an integrated circuit (IC) on one and the same substrate, while the mask pattern and the substrate are moved with respect to each other between two successive illuminations, for example, along two mutually perpendicular directions in a plane parallel to the substrate plane and the mask plane.

Integrated circuits are manufactured by means of diffusion and masking techniques. A number of production masks with different mask patterns are consecutively projected on one and the same location on a semiconductor substrate (production substrate). Between the consecutive projections on the same locations the production substrate must undergo the desired physical and chemical variations. To this end the substrate must be removed from the apparatus after it has been illuminated with a production mask pattern, and after it has undergone the desired process steps, it must be placed in the apparatus again in the same position so as to illuminate it with a second production mask pattern, and so forth, while it must be ensured that the images of the second production mask pattern and the subsequent production mask patterns are positioned accurately with respect to the substrate.

Diffusion and masking techniques can also be used in the manufacture of other structures having detailed dimensions of the order of micrometers, for example, structures of integrated optical systems or guiding and detection patterns of magnetic domain memories and structures of liquid crystal display panels. In the manufacture of these structures the images of mask patterns must also be aligned very accurately with respect to a substrate.

In connection with the large number of electronic components per unit of surface area of the substrate and the resultant small dimensions of these components, increasingly stricter requirements are imposed on the accuracy with which the integrated circuits are manufactured. The position where the consecutive production masks are imaged on the production substrate must therefore be established more and more accurately. Due to the smaller depth of focus of the projection lens with which smaller details can be projected, it must also be possible to focus more accurately.

In order to be able to realise the desired, very precise positioning accuracy within several tenths of one micrometer of the image of the mask pattern with respect to the production substrate, the projection apparatus comprises a device for aligning the production substrate with respect to the production mask pattern. With this device an alignment mark provided in the production substrate is imaged on an alignment mark provided in the production mask. If the image of the substrate alignment mark accurately coincides with the mask alignment mark, the production substrate is correctly aligned with respect to the production mask pattern. The main element for imaging the production substrate mark on the production mask mark is constituted by the projection lens system with which the production mask pattern is imaged on the production substrate.

This projection lens system is designed and optimally corrected for the wavelength of the projection beam. This wavelength is as small as possible so that the smallest possible details can be projected at the same numerical aperture of the projection lens system. In the current projection apparatuses this wavelength is, for example, 365 nm with which line widths of approximately 0.7 $\mu$m can be projected. The alignment beam, i.e. the beam used in the alignment device has such a wavelength that the photoresist on the production substrate is insensitive thereto so that such a beam cannot cause a change in the photoresist provided on the substrate and is not weakened by this photoresist. This alignment beam is, for example, a Helium-Neon laser beam with a wavelength of 633 nm. Although the wavelength of the alignment beam is not adapted to the projection lens system, the alignment marks of the production mask and the production substrate can be aligned satisfactorily with respect to each other if a correction element, for example, a lens is arranged in the path of the alignment beam only.

However, since the projection beam and the alignment beam have different wavelengths, the problem remains that changes of, for example, ambient parameters such as temperature have a different effect on the images which are formed with the projection beam and the alignment beam, respectively. Consequently, the alignment device may detect a satisfactory mutual alignment of the alignment marks associated with this device, while the mask image formed by means of the projection beam is incorrectly located with respect to the substrate. A mechanical drift in the projection apparatus which cannot be detected with the alignment device may also occur. It is therefore necessary to calibrate the conventional alignment system periodically, for example, once or several times a day.

To this end the apparatus according to U.S. Pat. No. 4,540,277 comprises an image detection device for checking, inter alia, the image formed by the projection beam. This device comprises a reference plate which is fixedly connected to the substrate table and in which four radiation-transmitting slits are provided and it is further provided with four radiation-sensitive detectors arranged under the slits and provided in the substrate table. For the periodical inspection of the projection apparatus a test or reference mask is provided on the mask table, which mask has marks which correspond to the marks on the reference plate. This plate is slid under the reference mask and in the path of the projection beam whereafter this beam is switched on, forming images of the four reference mask marks on the four marks of the reference plate. The four detectors which receive the radiation transmitted by the reference plate marks then supply signals from which the extent of alignment of the reference mask with respect to the reference plate can be derived. Since the reference plate is also provided with alignment marks cooperating with the conventional alignment system, it can be ascertained whether an extent of alignment detected by means of the image detection system corresponds or does not correspond to the extent of alignment as is measured with the conventional alignment device. With the help of this checking, the last-mentioned device can be calibrated.

U.S. Pat. No. 4,540,277 also notes that a magnification error of the image formed with the projection beam can also be measured by means of the image detection device by establishing whether the images of the mask reference marks cover the marks of the reference plate to an equal extent. Since the projection lens system in the apparatus according to U.S. Pat. No. 4,540,277 is non-telecentric at the object side, or mask side, a magnification error can be eliminated by adapting the distance between the mask and the projection lens system.

The known image detection device operates in transmission so that it is necessary to provide the detectors in the substrate table. These detectors require extra space so that the substrate table must be bigger and heavier and must also be moved over larger distances during the measurements. This results in additional problems for the servo devices and has a negative influence on the measuring and setting accuracies.

The marks of the known image detection device consist of slits which may be two-dimensional so as to enable measurement in two mutually perpendicular (X-Y) directions. To achieve the desired positioning accuracy, the slits must be very narrow and consequently the quantity of radiation on the detectors is small and the signal-to-noise ratio leaves much to be desired, while very strict requirements must be imposed on the geometry of the slits.

Since only one detector is present for each mark of the reference plate, the X and Y positions for each mark of the reference plate with respect to the associated reference grating mark cannot be determined separately even when using two-dimensional slits.

The above-mentioned problem that, due to the different wavelengths of the alignment beam and the projection beam, an alignment detected by the alignment beam as being correct does not need to correspond to a correct alignment in projection radiation will be greater as more electonic components per unit of surface area are to be provided on the substrate. These components must then have even smaller dimensions and a projection apparatus is required which can make images in a repetitive manner whose details or line widths are considerably smaller than one micrometer. This means that the resolving power of the projection lens system must be increased. As is known, this resolving power is proportional to $NA/\lambda$ in which NA is the numerical aperture of the projection lens system and $\lambda$ is the wavelength of the projection beam. The numerical aperture is already fairly high, for example, $NA = 0.48$ for known projection lens systems.

Another important factor is that the depth of focus of the lens system, which should be as large as possible, is proportional to $\lambda/NA^2$ so that an enlargement of the numerical aperture is more detrimental to the depth of focus than a reduction of the wavelength.

Substantially the only possibility which is then left for realising the desired imaging with details of the order of 0.4 μm with the desired depth of focus is to make use of a projection beam having a considerably smaller wavelength than has hitherto been conventional. In order to be able to project the mask pattern on the substrate by means of such a short-wave beam, lens elements of quartz must be used. Since quartz is very dispersive, the radiation used should have a very narrow wavelength band. Therefore, a radiation source will have to be used which emits a large power within a narrow wavelength band. A real possibility then is the use of an excimer laser, for example, a Krypton-Fluoride laser having a wavelength of 248 nm, an Argon-Fluoride laser having a wavelength of 193 nm, or an Nd-YAG laser whose frequency is quadrupled and which has a wavelength of 256 nm. A projection beam must then be used whose wavelength is of the order of 2.5-3.2 times the wavelength of the alignment beam.

When forming images with said small dimensions of the details, not only the problems mentioned in U.S. Pat. No. 4,540,277, namely the alignment, image rotation, magnification error and anamorphotic imaging error will be greater but new problems will also occur which predominantly relate to the image quality of the projection lens system.

Although there has been a breakthrough in the field of projection lens systems, enabling projection line widths of the order of $-0.4$ μm in an image field of the order of 25 mm, these projection lens systems are very sensitive to variations of the ambient parameters such as air pressure and temperature. Due to the high dispersion of the lens material, a change of the wavelength of the projection beam influences the imaging quality, i.e. the position and the quality of the image formed with this beam. Problems with third-order distortion, image astigmatism and image field curvature may arise in the projection apparatus. The novel generation of projection lens systems with their very high resolving power and a relatively large image field have a very small depth of focus so that focusing errors, inter alia resulting from the larger wavelength dependence of the projection lens system, have an increasing influence. These errors should be detected very accurately and it will then be necessary to calibrate also a focus error detection device periodically. Moreover, the influence of mechanical drift will increase as the image details become smaller.

The article "Characterization and Set-up Techniques for a 5× Stepper", by T. A. Brunner in SPIE, Vol. 633: Optical Microlithography V 1986, pp. 106–112, describes a so-called scanning slit image detector which comprises a reference plate on which a plurality of fluorescent strips is provided, which reference plate must be provided on the substrate table of a projection apparatus so as to scan the image of a test mask. The diffuse scattered radiation emitted by the fluorescent strips is received by one detector. In the known image detection device radiation from the entire pupil of the projection lens system can reach the relatively large detector so that the signal-to-noise ratio of the measuring signals leaves much to be desired. Moreover, there is a risk that non-uniform scattering takes place and since only one detector is used, the effective measurement, via the image detection device, in the pupil of the projection lens system may be asymmetrical. In the known image detection device an incoherent detection method is used.

OBJECTS AND SUMMARY OF THE INVENTION

The present invention has for one of its objects to provide a novel concept for image detection with which on the one hand an image detection device and a method by which only a limited number of parameters must be measured can be simplified and with which on the other hand an image detection method and device can be realised, enabling not only all parameters influencing the image quality and the image position to be determined but also enabling the image position itself and the image quality itself to be determined very rapidly and with which an optimization of the image quality as well as a calibration of the servo systems with which the image position is controlled can be realised rapidly.

To this end the method according to the invention is characterized in that simultaneously with the signals of the image detection device also signals of a substrate table position detection device and of an optical focus error detection device are electronically processed, in that a plurality of image detection detectors is used for each reference plate mark, in that said detectors only receive radiation from an associated reference plate mark, and in that the signals of the image detection device, of the substrate table position detection device and of the optical focus error detection device are also processed to a calibration signal for the focus error detection device and to at least one control signal with which at least one of the parameters influencing the image quality is adjusted.

Said parameters are:
the wavelength of the projection beam
the gas pressure within the projection lens system
the temperature within the projection lens system
the composition of the medium in one or more of the compartments within the projection lens system
the mutual distance between the lens elements in the projection lens system
the zero-setting of the alignment device
the zero-setting of the focusing device.

More, and independent, servo information can be obtained by using a plurality of detectors for each reference plate mark. A reference for the signals of the image detection detectors is obtained by simultaneously processing the substrate table position information.

The present invention is based on the recognition that not all separate parameters determining the projection quality have to be known precisely, but that the image quality and the image position as a whole should be known and that in the case of a measured detoriation of this quality and position error the measuring signals should be simultaneously processed in a computer and via a model comprising all parameters and their mutual relations to form control signals for correcting one or more of the apparatus parameters so that the image acquires the desired quality and position.

The conventional alignment, focusing and substrate table position detection devices are coupled together via the image detection device so that an integrated measuring system is obtained with which all relevant parameters can be measured.

In the image detection device according to the invention the detection is substantially coherent so that an improved phase detection is obtained over the detector described by Brunner. In the image detection device according to Brunner the reference plate must be moved in small steps over the entire image formed by the projection beam because no use is made of substrate table position detection device signals. Moreover, Brunner does not reveal whether and how the information of the image detection device is used for correcting the projection quality and/or the image position.

In the simplest embodiment of the method of the invention use is made of one reference plate mark in the form of a two-dimensional grating, and of four radiation-sensitive detectors. The position along three mutually perpendicular axes of the image of a mask mark as well as astigmatism in this image can then be detected. Only one mask mark in the form of a two-dimensional grating is then used. This grating mark may be provided in a production mask outside the mask pattern to be projected on the substrate so that it is not necessary to use a separate reference mask.

To be able to measure more accurately the X, Y and Z positions and the astigmatism, as well as a magnification error and third-order distortion of the projection beam image and possibly a tilt of the projection beam image, the method according to the invention is preferably characterized in that use is made of at least three two-dimensional grating marks, a corresponding number of analog mask marks and four image detection detectors per reference plate mark.

Information about the position along three mutually perpendicular axes, the rotation about the same axes as well as information about the magnification, the astigmatism and third-order distortion of the image of the three mask marks can then be obtained simultaneously. Since the information of three marks is processed simultaneously, the image detection procedure can be reduced considerably.

The third-order distortion is the so-called radial distortion, i.e. the difference between the magnification, measured in the radial direction, in the centre of the image field and that at another point in the image field.

The three mask marks may again be provided in a reference mask or in a production mask outside the mask pattern which must be projected on a production substrate.

The method according to the invention is preferably further characterized in that use is made of a separate, very stable reference plate with grating marks integrated therein and in that after measuring and setting a first projection apparatus said reference plate is used for measuring and setting a second and possible subsequent projection apparatuses.

It is to be noted that the use of a reference plate associated with an image detection device for measuring and setting a plurality of projection apparatuses, in order to adapt these apparatuses to one another in such a way that they can be used side by side for processing the same semiconductor substrate, is known per se from the article "A Stepper Image Monitor for Precise Set-up and Characterization", by T. A. Brunner, in "SPIE", Vol. 922: "Optical/Laser Microlithography", 1988, pp. 365-375. This reference plate comprises linear elevations which are considerably narrower than the areas between the elevations and which scatter incident projection radiation with which an image of a reference mask is formed. A small portion of the scattered light is received by a single large detector. Also in this image detection device, likewise as in that according to the 1986 "SPIE", Vol. 633 article by Brunner there is a risk of non-uniform scattering and asymmetrical measurement in the pupil of the projection lens system. The reference plate must again be moved in small steps across the image which is formed by the projection radiation and after each step a waiting time should be observed until stabilization has set in, which makes the measurement time-consuming. Moreover, it has not been revealed whether and how the information of the image detection device is used for correcting the image quality and/or the image position.

A method according to the invention in which use is made of a pulsed radiation source for the projection beam is preferably further characterized in that a series of synchronization pulses is used during the measurement, each pulse simultaneously igniting the source and sampling the signals of the substrate table position detection device, of the image detection device and of the focus error detection device. Inaccuracies of said detection devices then do not affect the measurements.

When a pulsed excimer laser is used as a radiation source, the wavelength during a pulse may differ from that during the next pulse and/or preceding pulse. A small variation of the wavelength, for example, 1 pm results in a relatively large displacement, for example, 130 nm of the projection beam focus.

A method according to the invention in which such a wavelength variation is taken into account is further characterized in that also the wavelength of the projection beam is measured for each pulse and is processed together with other measuring signals.

It is not only the wavelength that can then be corrected but also the wavelength variation can be taken into account during processing of the measuring signals.

In principle, the surface of the reference plate need only have the size of the image field of the projection lens system. Particularly the method in which the idea of a separate reference plate is used may be further characterized in that use is made of a reference plate having the size of a production substrate and having a plurality of groups of at least three grating marks, each group being located within an area having the size of the image field of the projection lens system.

This extensive reference plate can then fulfil the function of the standard or calibration substrate so called "Holy" "wafer") which is used to match projection apparatuses, as is described in the article "Matching Management of Multiple Wafer Steppers using a Stable Standard and a Matching Simulator" in "SPIE" Vol. 1087, San Jose, U.S.A., February 1989: "Integrated Circuit Metrology and Process Control". The known standard substrate comprises a plate on which a plurality of permanent (phase) marks are provided. A photoresist layer is provided on this plate and subsequently the marks of a standard mask are projected on this layer next to the permanent marks. The standard substrate is then developed and subsequently the parameters of the projection apparatus used are determined by comparing the projected marks with the grating marks. For a second and subsequent projection apparatus the layer with the projected marks must be removed and a new photoresist layer must be provided whereafter the procedure of exposure, development and comparison is repeated. The parameters of the different projection apparatuses can then be compared and these apparatuses can be matched.

When an extended reference plate according to the invention is used which is characterized by a size corresponding to that of a production substrate and by a plurality of groups of two-dimensional marks, each group being present within a separate area of the reference plate corresponding to an area on the production substrate which is intended to receive a production mask pattern image, the apparatuses can be matched considerably more rapidly because the steps of providing, developing and removing the photoresist layer are no longer necessary. Moreover, matching can be effected more accurately because the number of measurements, and hence the number of measuring errors, is reduced.

The present invention also relates to a novel reference plate. This plate is characterized by a plate substrate of very stable material in which at least one reference mark in the form of a two-dimensional grating is integrated.

As compared with other marks, such as square marks or strips, diffraction gratings have the advantage that averaging of the gratings occurs during measuring. As a result it is possible to measure accurately, even if one or more grating lines are absent or if the grating lines deviate from straight lines so that it is not necessary to impose extremely stringent requirements of accuracy on these gratings. Particularly when they are used in an image detection device, the diffraction gratings have the advantage that they concentrate the incident radiation in certain directions so that the quantity of radiation on the associated detectors may be relatively large. This results in a considerable increase of the signal-to-noise ratio as compared with the image detection devices as described in said Brunne Spie publications: in which devices the radiation incident on the reference plate is diffusely scattered instead of diffracted in given directions.

The reference plate is preferably further characterized in that the plate substrate is made of a very stable material and in that at least three reference marks in the form of two-dimensional gratings are integrated in the plate substrate.

Such a reference plate provides the possibility of simultaneously measuring at three points of the image field. The mutual positions of the plate marks are made very stable by using a very stable plate material such as quartz or Zerodur.

The reference plate may be further characterized by a size corresponding to the size of a production substrate and by a plurality of groups of two-dimensional marks, each group being present within a separate area of the reference plate corresponding to an area on the production substrate which is intended to receive one image of production mask pattern.

This reference plate is eminently suitable for matching different projection apparatuses.

The present invention is mainly embodied in a novel projection apparatus intended for implementation of the method. As compared with the apparatus mentioned in the opening paragraph, this apparatus is characterized in that the reference plate marks are formed by two-dimensional grating marks whose grating strips extend in the X and Y directions of a system of coordinates whose Z axis is parallel to the optical axis of the projection lens system, in that for each grating mark four radiation-sensitive detectors are present for receiving the radiation deflected by the relevant grating mark, and in that a lens system for projecting only the relevant grating mark on the relevant detector is arranged between each grating mark and each associated detector.

Since the grating marks are two-dimensional and a separate detector is present for each dimension, X and Y, of each grating mark, the X and Y positions of the image of the reference mask mark associated with such a reference grating can be measured separately.

By using four detectors per grating mark the information about the position in the X and Y directions can be separated from that in the Z direction, and moreover the influence of intensity variations of the projection beam can be eliminated.

Since each projection system forms an image of the associated grating whose image size is equal to the radiation-sensitive surface of the associated detector, it is achieved that radiation from the ambience of the grating cannot reach the detector, which is favourable for the signal-to-noise ratio of the measuring signals.

In principle, a grating mark in the reference plate may comprise two grating portions, the grating strips of one grating portion extending in the X direction and those of the other grating portion extending in the Y direction. However, the apparatus is preferably further characterized in that each reference plate grating mark comprises two grating portions whose grating strips have a first direction and two grating portions whose grating strips have a second direction perpendicular to the first direction, and in that the four grating portions are located symmetrically around the centre of the grating.

Since both the X grating portions and the Y grating portions are positioned mirror-symmetrically with respect to lines at an angle of 45° to the grating strips, it is possible to compensate for measuring errors, if any.

A preferred embodiment of the apparatus according to the invention is characterized in that the period of each grating mark is substantially equal to the resolving power of the projection lens system.

Since the resolving power of the projection lens system, i.e. the number of lines per mm which this system can image separately, is determined by the smallest dimensions in the production masks, it will be realized that measuring takes place with a reference mask whose detail dimensions correspond as satisfactorily as possible to those of the production masks.

The apparatus according to the invention may be further characterized in that the grating parameters of each grating mark are adapted to the position and numerical aperture of the associated lens systems so that a maximum quantity of radiation of the relevant grating mark is captured by the associated detectors.

Said grating parameters are: the grating period, the ratio between the grating strip width and the grating period, the depth or height of the grating strips and the shape of the grating strips.

In accordance with a further characteristic feature of the invention, the reference plate gratings are phase gratings. These gratings generally have a better efficiency than amplitude gratings. Moreover, the geometry of phase gratings provides more possibilities for adaptation to the envisaged object.

The quantity of radiation from each reference plate grating mark to the associated detectors can be maximized by choosing, for example, the angles of inclination of the grating grooves in such a way that these inclinations direct the radiation towards the associated detectors.

However, the ratio between the grating groove width and the grating period is preferably adapted in order to achieve this object.

A projection apparatus in which such an adaptation of the grating marks is realized may be further characterized in that the grating parameters are optimized for two different wavelengths of the projection beam.

If these wavelengths are 248 nm and 365 nm, the projection apparatus is particularly characterized in that the ratio between the grating groove width and the grating period is substantially ¼ and in that the grating period is approximately 0.84 $\mu$m.

With such a grating mark, projection radiation having a wavelength of 365 nm or a wavelength of 248 nm can be satisfactorily concentrated on the detectors, while different diffraction orders are of course captured for the different wavelengths.

The apparatus according to the invention is preferably further characterized in that the grating marks are reflective.

The inventive idea may in principle also be realized with transmission gratings, but since the use of transmission gratings requires larger substrate tables, reflection gratings are as yet preferred, all the more because they provide the possibility of matching different projection apparatuses.

An embodiment using reflection gratings is preferably further characterized in that all detectors associated with the image detection device, as well as the lens systems associated with said detectors are fixed in an annular holder which is connected to the projection lens system.

The different detectors and projection systems can then already be aligned by positioning them in the accurately made holder.

A preferred embodiment of the apparatus according to the invention is further characterized in that the different sets of four detectors are associated with different areas in the image field of the projection lens system, the centres of said areas being located at different distances from the centre of the image field.

If this condition is satisfied, third-order distortion of the image formed by means of projection radiation can be measured, independent of the substrate table position detection device.

A projection apparatus in which an ultraviolet radiation beam is used is preferably further characterized in that each detector is preceded by a luminescent plate which converts the projection radiation into radiation to which the detector is very sensitive.

Conventional detectors can then be used.

The projection apparatus is further characterized in that the reference plate is coupled the production substrate table to a position detection device for detecting positions along at least two mutually perpendicular axes and rotations about said axes, and in that the signal outputs of said device, of the image detection device, of the alignment detection device and of a focus error detection device are connected to the inputs of an electronic signal processing device which supplies control signals for correcting one or more of the following parameters:

the wavelength of the projection beam;
the pressure within the projection lens holder;
the mutual distances between the lens elements of the projection lens system;
the composition of the medium in one or more of the compartments of the projection lens holder;
the temperature within the projection lens holder
the zero-setting of the alignment device;
the zero-setting of the focusing device;
the magnification of the projection lens system.

Such a projection apparatus in which a short-wave pulsed laser is used as a radiation source and which is provided with a projection beam wavelength measuring device for measuring the wavelength per pulse may be characterized in that the output of the wavelength measuring device is connected to an input of the electronic signal processing device.

Consequently, the magnitude of the wavelength at the instant of measuring can be taken into account when the measuring signals are processed.

BRIEF DESCRIPTION OF THE DRAWINGS

Embodiments of the invention will now be described in greater detail with reference to the accompanying drawings in which FIG. 1a–1c show diagrammatically an embodiment of an apparatus for repetitively projecting a mask pattern on a substrate.

DESCRIPTION OF THE PREFERRED EMBODIMENTS

Figure 1A:
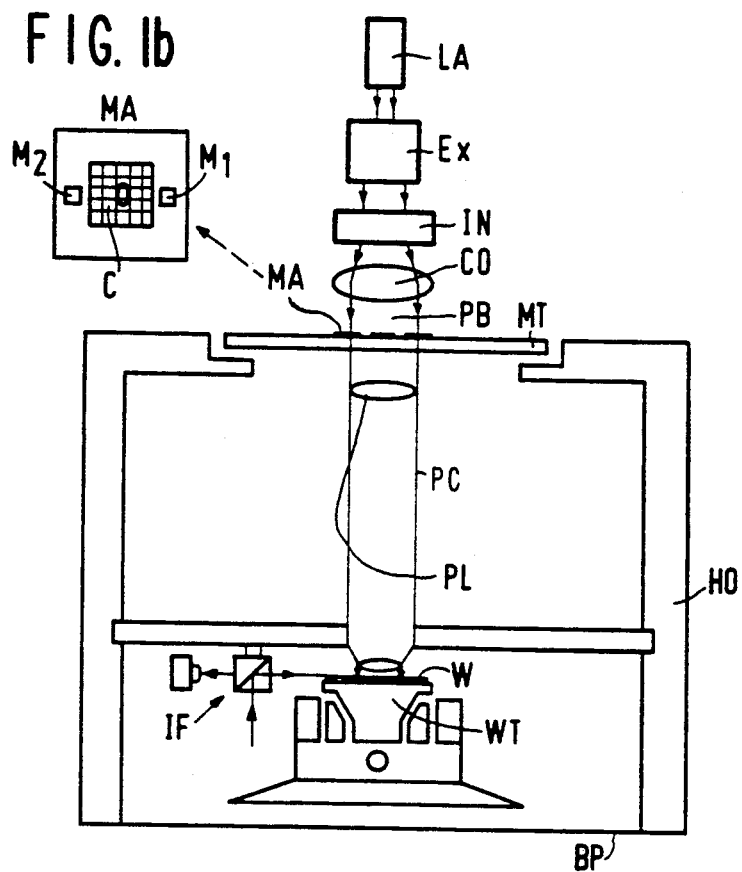

FIG. 1a shows diagrammatically a known embodiment of an apparatus for repetitively projecting a mask pattern on a substrate. The main components of this apparatus are a projection column, in which a mask pattern C to be projected is arranged, and a movable substrate table WT with which the substrate can be positioned with respect to the mask pattern C.

The projection column incorporates an illumination system which comprises, for example a laser LA, a beam widener $E_x$, an element IN, also referred to as integrator which produces a homogeneous distribution of radiation within the projection beam PB, and a condensor lens CO. The projection beam PB illuminates the mask pattern C present in the mask MA which mask is arranged on a mask table MT.

The beam PB passing through the mask pattern C traverses a projection lens system PL arranged in the projection column and shown only diagrammatically, which system forms an image of the pattern C on the substrate W. The projection lens system has, for example a magnification M=1/5, a numerical aperture N.A.=0.48 and a diffraction-limited image field with a diameter of 22 mm.

The substrate W is arranged on a substrate tabel WT supported in, for example air bearings. The projection lens system PL and the substrate table WT are arranged in a housing HO which is closed at its lower side by a base plate BP of, for example granite, and at its upper side by the mask table MT.

Figure 1C:
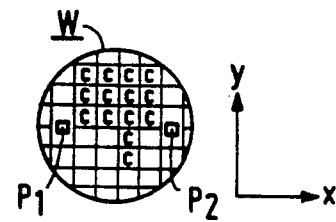

As is shown in FIG. 1b, the mask MA has two alignment marks $M_1$ and $M_2$. These marks preferably consist of diffraction gratings, but they may be alternatively formed by other marks such as squares or strips which are optically distinguished from their surroundings. The alignment marks are preferably two-dimensional, i.e. they extend in two mutually perpendicular directions, the X and Y directions in FIG. 1c. The substrate W, for example, a semiconductor substrate, on which a number of images of the pattern C must be formed, which images are arranged side by side, comprises a plurality of alignment marks, preferably also two-dimensional diffraction gratings, two of which, $P_1$ and $P_2$, are shown in FIG. 1c. The marks $P_1$ and $P_2$ are located outside the areas on the production substrate W where the images of the pattern C must be formed. Preferably, the grating marks $P_1$ and $P_2$ are in the form of phase gratings and the grating marks $M_1$ and $M_2$ are in the form of amplitude gratings.

Figure 2:
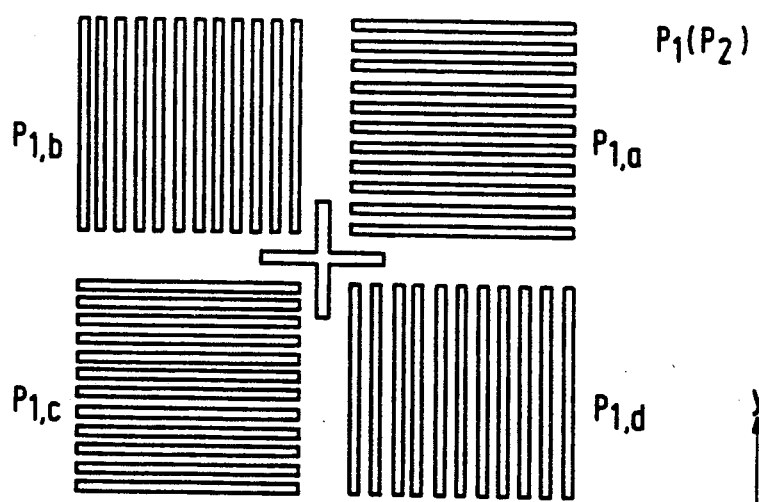
FIG. 2 shows a known embodiment of an alignment mark in the form of a two-dimensional grating.

FIG. 2 shows an embodiment of one $P_1$ of the two identical substrate phase gratings $P_1 P_2$ on a larger scale. Such a grating may comprise four sub-gratings $P_{1,a}$, $P_{1,b}$, $P_{1,c}$ and $P_{1,d}$, two of which, $P_{1,b}$ and $P_{1,d}$, are used for alignment in the X direction and the two other sub-gratings, $P_{1,a}$ and $P_{1,c}$, are used for alignment in the Y direction. The two sub-gratings $P_{1,b}$ and $P_{1,c}$ have a grating period of, for example, 16 μm and the sub-gratings $P_{1,a}$ and $P_{1,d}$ have a grating period of, for example, 17.6 μm. Each sub-grating may have a dimension of, for example, 200×200 μm. An alignment accuracy which in principle is less than 0.1 μm can be achieved with this grating and a suitable optical system. Different grating periods have been chosen so as to increase the capture range of the alignment device.

Figure 3:
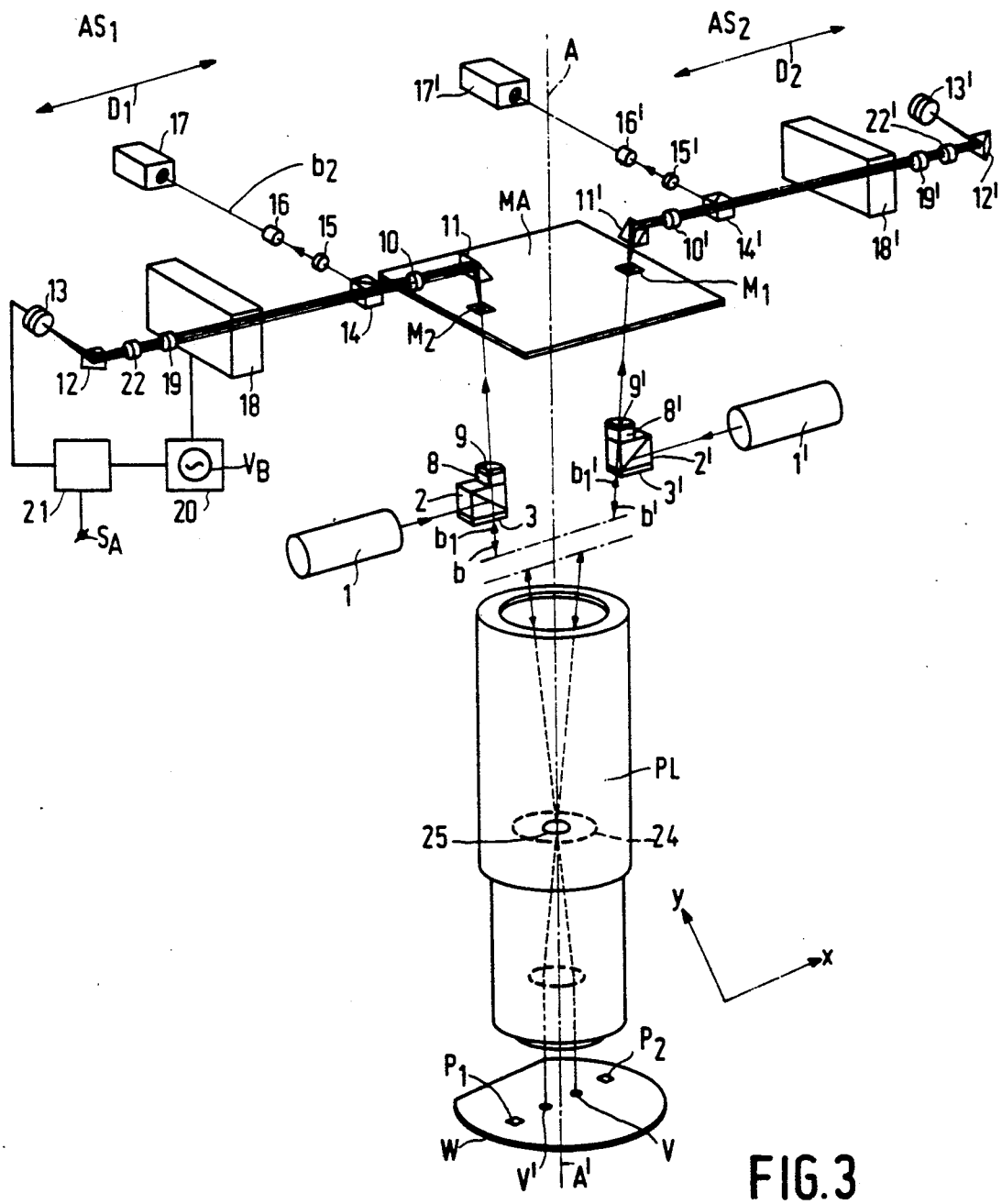
FIG. 3 shows a double alignment detection device for aligning a production mask with respect to a production substrate.

FIG. 3 shows the optical elements of the apparatus which are used for aligning a production mask with respect to a production substrate. The apparatus comprises a double alignment detection system comprising two separate and identical alignment systems $AS_1$ and $AS_2$ which are positioned symmetrically with respect to the optical axis AA' of the projection lens system PL. The alignment system $AS_1$ is associated with the mask alignment mark $M_2$ and the alignment system $AS_2$ is associated with the mask alignment mark $M_1$. The corresponding elements of the two alignment systems are denoted by the same reference numerals, those of the system $AS_2$ being distinguished from those of the system $AS_1$ by their primed notation.

The structure of the system $AS_1$ as well as the way in which the mutual position of the mask mark $M_2$ and, for example, the substrate mark $P_1$ is determined, will now be described.

The alignment system $AS_1$ comprises a radiation source 1, for example, a Helium-Neon laser which emits an alignment beam b. This beam is reflected towards the production substrate W by a beam splitter 2. The beam splitter may be a partly transparent mirror or a partly transparent prism, but it is preferably a polarization-sensitive splitting prism which is succeeded by a λ/4 plate 3 in which λ is the wavelength of the beam b. The projection lens system PL focuses the beam b to a small radiation spot V having a diameter of the order of 1 mm on the substrate W. This substrate reflects a part of the beam as beam $b_1$ in the direction of the mask MA. The beam $b_1$ traverses the projection lens system PL, which system images the radiation spot V on the mask. Before the substrate is arranged in the illumination apparatus, it has been pre-aligned in a pre-alignment station coupled to the apparatus, for example, the station described in European Patent Application no. 0,164,165, so that the radiation spot V is located on the substrate mark $P_2$. This mark is then imaged by the beam $b_1$ on the mask mark $M_2$. Taking the magnification of the projection lens system into account, the dimension of the mask mark $M_2$ is adapted to that of the substrate mark $P_2$ so that the image of the mark $P_2$ accurately coincides with the mark $M_2$ if the two marks are mutually positioned in the correct manner.

On its path to and from the substrate W the beam b and $b_1$ has traversed twice the λ/4 plate 3 whose optical axis extends at an angle of 45° to the direction of polarization of the linearly polarized beam b coming from the source 1. The beam $b_1$ passing through the λ/4 plate then has a direction of polarization which is rotated 90° with respect to the beam b, so that the beam $b_1$ is passed by the polarization splitting prism 2. The use of the polarization splitting prism in combination with the λ/4 plate provides the advantage of a minimum radiation loss when coupling the alignment beam into the radiation path of the alignment system.

The beam $b_1$ passed by the alignment mark $M_2$ is reflected by a prism 11 and directed, for example, by a further reflecting prism 12 towards a radiation-sensitive detector 13. This detector is, for example, a composite photodiode having, for example, four separate radiation-sensitive areas in conformity with the number of sub-gratings according to FIG. 2. The output signals of this detector are a measure of the coincidence of the mark $M_2$ with the image of the substrate mark $P_2$. These signals may be processed electronically and used for moving the mask with respect to the substrate by means of driving systems (not shown) so that the image of the mark $P_2$ coincides with the mark $M_2$. Thus, an automatic alignment device is obtained.

A beam splitter 14 in the form of, for example, a partly transparent prism may be arranged between the prism 11 and the detector 13, which beam splitter splits a part of the beam $b_1$ as beam $b_2$. The split beam $b_2$ is then incident via, for example, two lenses 15 and 16 on a television camera 17, which is coupled to a monitor (not shown) on which the alignment marks $P_2$ and $M_2$ are visible to an operator of the illumination apparatus. This operator can then ascertain whether the two marks coincide and, if necessary, he may move the substrate W by means of manipulators so as to cause the marks to coincide.

Analogously as described hereinbefore for the marks $M_2$ and $P_2$, the marks $M_1$ and $P_2$ and the marks $M_1$ and $P_1$, respectively, can be aligned with respect to each other. The alignment system $AS_2$ is used for the two last-mentioned alignments.

For details about the alignment procedure by means of the alignment systems reference is made to U.S. Pat. No. 4,778,275. As has also been described in this Patent, the alignment systems $AS_1$ and $AS_2$ are in a very close working relationship with an extremely accurate two-dimensional movement measuring system for measuring the movement of the substrate with respect to the mask during the alignment procedure. The positions of and the mutual distances between the alignment marks $P_1$ and $P_2$, $M_1$ and $M_2$ can then be laid down in a system of coordinates determined by the movement measuring system. The movement measuring system, which is denoted by IF in FIG. 1a is, for example, an interferometer system described in U.S. Pat. No. 4,251,160.

Since the projection lens system PL is designed for the wavelength of the projection beam PB, which must be as small as possible in view of the desired large resolving power, and may therefore differ considerably from that of the alignment beam, deviations may occur when using this PL system for imaging the alignment marks $P_1$, $P_2$ and $M_1$, $M_2$ on each other. The substrate alignment marks $P_1$, $P_2$ will then not be imaged in the plane of the mask pattern in which the mask alignment marks are located, but will be imaged at a given distance therefrom, which distance depends on the difference between the wavelengths of the projection beam and the alignment beam and on the difference between the refractive indices of the material of the projection lens elements for the two wavelengths. If the projection beam has a wavelength of, for example, 248 nm and the alignment beam has a wavelength of 633 nm, this distance may be as large as 2 m. Moreover, due to said wavelength difference a substrate alignment mark is imaged on a mask alignment mark with a magnification which deviates from the desired magnification, while the deviation increases with an increasing wavelength difference.

To correct for said deviations, the projection column PL may incorporate an extra lens, or correction lens 25. In contrast to what is shown in FIG. 3, the alignment beam is not coupled into the apparatus at a position above the projection lens but through a window in the lens holder and with a reflecting element such as a wedge under and proximate to the correction lens. The correction lens is arranged at such a height in the projection column that the sub-beams of the different diffraction orders of the alignment beam, which sub-beams are formed by a substrate alignment mark, are sufficiently separated in the plane of the correction lens so as to be able to influence these sub-beams separately, while this correction lens has a negligible influence on the projection beam and the mask image formed therewith. The correction lens is preferably situated in the rear focal plane of the projection lens system. If this system is telecentric at the substrate side, this focal plane coincides with the plane of the exit pupil of this system. If, as is shown in FIG. 3, the correction lens 25 is situated in a plane 24 in which the chief rays of the alignment beams b and b' intersect one another, this lens may be simultaneously used for correcting the two alignment beams.

The correction lens has such a power that it changes the directions of the sub-beams which are diffracted in the first order by a grating, such that the chief rays of these beams intersect one another in the plane of the mask alignment mark $M_2$. Moreover, the correction lens has such a small diameter that the higher order sub-beams which are diffracted by the mark $P_2$ through larger angles than the first-order sub-beams do not pass through this lens. Furthermore, an element is arranged at the correction lens, which element prevents the zero-order sub-beams from passing through the correction lens. This element may be in the form of said wedge which is used to couple the alignment beam into the projection lens system. It is achieved by said measures that only the first-order sub-beams are used for imaging the grating $P_2$ on the grating $M_2$ so that some additional advantages are obtained.

By suppressing the zero-order sub-beam, the contrast in the image of $P_2$ can be increased considerably. Since the second and higher order sub-beams are suppressed, irregularities in the grating $P_2$ do not have any influence on the alignment signal. When using the first-order sub-beams only, the second harmonic of the grating $P_2$ is projected, as it were, i.e. apart from the magnification M of the projection lens system PL, the image of $P_2$ has a period which is half that of the grating $P_2$. If it is ensured that the grating period of the grating $M_2$ is equal to that of the image of $P_2$, i.e. equal to m/2 times the grating period of the grating $P_2$, the accuracy with which the gratings $M_2$ and $P_2$ are aligned is twice as large as in the case where the complete beam b is used for the projection.

After having described the system $AS_1$, which is used for aligning the mask alignment mark $M_2$ with respect to a substrate alignment mark, the system $AS_2$ with which the mask alignment mark $M_1$ is aligned with respect to a substrate alignment mark need not be further explained. The system $AS_2$ comprises similar elements and operates in the same way as the system $AS_1$. As is already shown in FIG. 3, the systems $AS_1$ and $AS_2$ have the correction lens 25 in common. Instead of a double alignment device, the projection apparatus may alternatively comprise a single alignment device as described, for example in U.S. Pat. No. 4,251,160.

The projection apparatus is also provided with a focus servo device comprising a focus error detection device for detecting, during repetitive imaging of a production mask on a production substrate, a deviation between the image plane of the projection lens system and the plane of the production substrate. When such a deviation occurs, the focusing can be corrected by means of the signal supplied by the focus error detection device, for example, by moving the projection lens along its optical axis.

Figure 4:
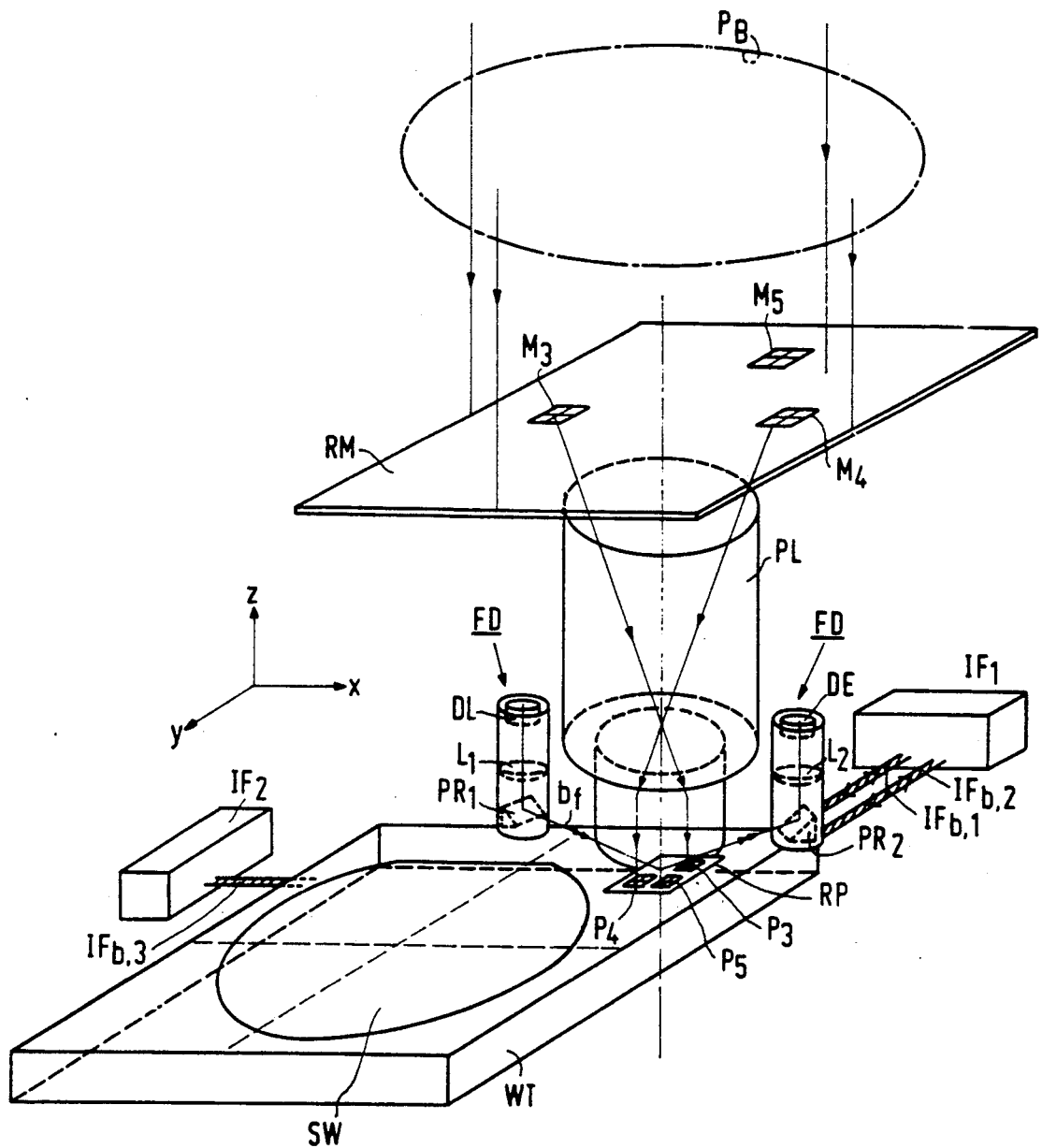
FIG. 4 shows the focus error detection device and the substrate table position detection device of the projection apparatus in which a reference plate and a reference mask are incorporated.

This focus error detection device FD is shown diagrammatically in FIG. 4. This Figure also shows the reference plate RP of the image detection device and the position detection device for the substrate table consisting of, for example, two parts $IF_1$ and $IF_2$.

The focus error detection device FD comprises a radiation source, for example, a diode laser DL which supplies a focusing beam $b_f$ and a prism $PR_1$ which reflects this beam towards a point on the reference plate RP where the optical axis of the projection lens system intersects this plate. For the sake of simplicity only the chief ray of this beam is shown. A lens $L_1$ arranged between the diode laser DL and the prism $PR_1$ focuses the beam to a radiation spot on the reference plate. The beam $b_f$ reflected by the reference plate is reflected by a second prism $PR_2$ towards a radiation-sensitive detector DE. A lens $L_2$ between the prism $PR_2$ and the detector images the radiation spot formed on the reference plate on the detector DE. When the distance in the Z direction between the projection lens system and the reference plate changes, the radiation spot formed on the detector DE moves in its own plane. Since the detector is a position-sensitive detector or comprises two separate detection elements, the movement of the radiation spot, and the focus error corresponding thereto, can be determined. The information thus obtained can be used to correct, for example, the Z position of the substrate table WT by means of a known parallelogram construction shown diagrammatically in FIG. 5. The different elements of the focus error detection device are arranged in two, for example, cylindrical holders which are fixedly connected to the holder of the projection lens system.

As described in U.S. Pat. No. 4,356,392, a reflector ensuring that the focusing beam is reflected a second time by the reference plate before being incident on a detector may be arranged at the position of the detector DE. This preferred embodiment of the focus error detection device has the advantage that the focus error measurement is not affected by a tilt of the reference plate or of a production substrate or by differences in local reflection of this substrate.

In order to determine the X and Y positions of the substrate table very accurately, the projection apparatus comprises a composite interferometer system consisting of, for example, two parts. The part $IF_1$ emits one or more beams in the Y direction to a reflecting side face of the substrate table and also receives the reflected beams. The X position of the table can thereby be determined. Analogously, the Y position of the substrate table can be detected by means of the interferometer part $IF_2$. The interferometer system may be implemented as described in U.S. Pat. No. 4,251,160 and then it operates with two beams. Instead of this so-called two-axis interferometer system, a three-axis system as described in U.S. Pat. No. 4,737,823, or a multiple axis system can be used.

The positions of, and the mutual distances between the alignment marks $P_1$ and $P_2$ and $M_1$ and $M_2$ can be laid down during alignment in a system of coordinates defined by the interferometer system by using the substrate table position detection device, or interferometer system. It is then not necessary to refer to the frame of the projection apparatus or to a component of this frame so that variations in this frame due to, for example, temperature variations, mechanical creep and the like do not have any influence on the measurements.

Figure 5:
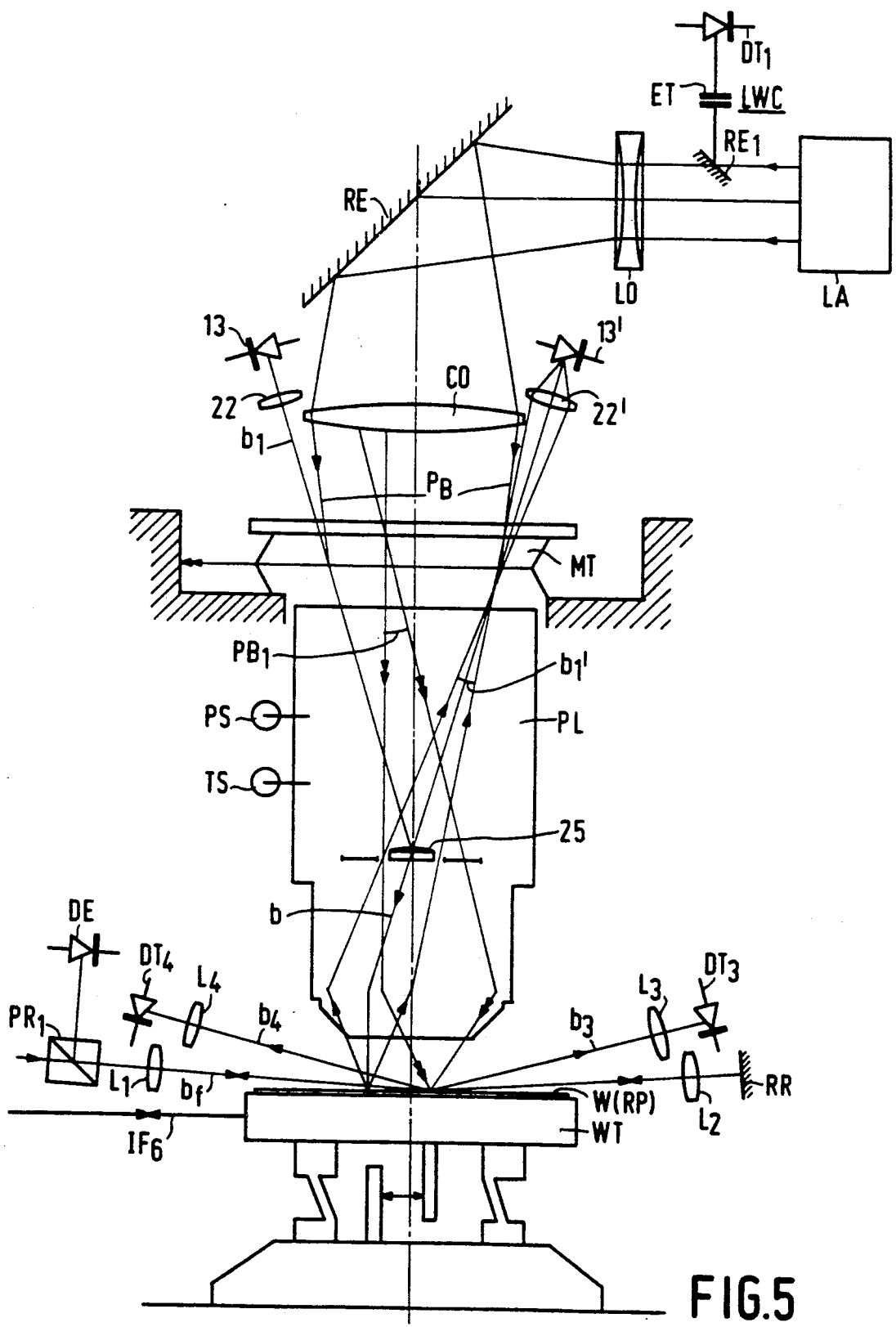
FIG. 5 shows a projection apparatus in a cross-section.

For better insight, the projection apparatus is once more shown in FIG. 5, this time in a cross-section. The illumination system has a slightly different structure than in FIG. 1 and comprises a laser LA, for example, a Krypton-Fluoride laser, a lens system LO, a reflector RE and a condensor lens CO. The illumination system comprises a known system LWC which is shown diagrammatically, with which the wavelength of the laser radiation can be checked. The system LWC is described in the article "Design Principles for an Illumination System using an Excimer Laser as a Light Source" in: SPIE Vol. 1138 (1989) pp. 121 etc.

The double alignment detection device is indicated by means of an incident beam b and the two emerging alignment beams $b_1$ and $b_1$ and by the elements 25, 13, 13', 22 and 22'. As described in U.S. Pat. No. 4,778,275, errors of the magnification with which a mask is imaged on a substrate can be determined by means of the double alignment detection device. This magnification error measurement is, however, not performed at the wavelength of the projection beam but at the wavelength of the alignment beams. If there is a large difference between these wavelengths, the magnification error must also be determined by means of the image detection device.

FIG. 5 further shows a focus error detection device with lenses $L_1$ and $L_2$ and a retroreflector RR which reflects along itself a focusing beam $b_f$ entering from the left and reflected a first time by a production substrate or a reference plate. The reflected beam $bf$ is reflected by the partly transparent prism $PR_1$ towards the detector DE.

FIG. 5 also shows a portion of the image detection device, namely two detection systems associated with a reference plate grating mark and each comprising a projection lens $L_3$, $L_4$ and a detector $DT_3$, $DT_4$. A beam portion $PB_1$ which forms part of the projection beam PB indicates how a part of the mask, for example, a mask mark is imaged on the reference plate.

The beam $IF_b$ indicates that the apparatus is also provided with a substrate table position detection device.

PS and TS refer to a pressure sensor and a temperature sensor, respectively.

The reference plate RP shown in FIG. 4 may be a fixed part of the mask table WT. Preferably, this plate is a separate element which is immovably connected to the table WT during use in the projection apparatus and is thus coupled to the substrate table position detection device. After the image detection procedure in a first projection apparatus has been completed, this plate can be provided in a second projection apparatus to perform the image detection procedure also in this apparatus, subsequently in a third projection apparatus, and so forth. Thus it is possible to set a whole series of projection apparatuses by means of the same reference and hence match them very accurately, which projection apparatuses are used, for example, for performing consecutive illuminations of a series of production substrates, each time with different production masks.

The reference plate is made of a very stable material such as quartz or glass whose dimensions are substantially not influenced by ambient parameters such as temperature, humidity, etc. It is then ensured that the positions of, and the mutual distances between the plate marks do not change.

As is shown in FIG. 4, the reference plate PR may have a small surface which is slightly larger than the image field of the projection lens system. However, it is alternatively possible to extend the reference plate to a special embodiment of a so-called standard substrate (holy wafer) which is used to match different projection apparatuses. The way in which this matching with a holy wafer is effected is described, in the article "Matching Management of Multiple Wafer Steppers using a Stable Standard and a Matching Simulator" in "SPIE," Vol. 1087, San Jose, USA, February, 1989. When the image detection device and the extensive reference plate are used, the mutual matching of different projection apparatuses can be effected considerably more rapidly because it is not necessary to provide a photoresist on the standard substrate, develop this resist and remove it again.

Figure 6:
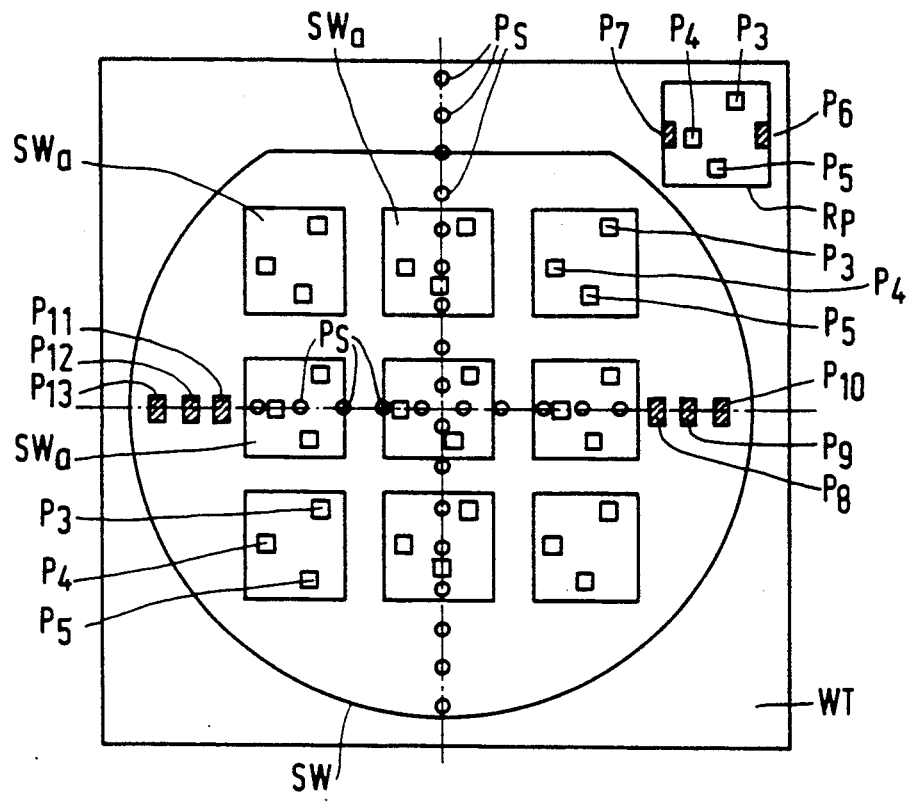
FIG. 6 shows a reference plate in the form of a standard substrate.

FIG. 4 shows how the standard substrate, or extensive reference plate SW can be provided in the projection apparatus. FIG. 6 shows the standard substrate in a plan view. This substrate is divided into a plurality of areas SWa of which only some are shown in FIG. 6 on an enlarged scale. In practice the number of areas SWa on the standard substrate may be equal for example to the number, 27, of ICs which must be formed on the production substrate. Each area SWa comprises three grating marks $P_3$, $P_4$ and $P_5$ analogous to the marks in the reference plate RP. The standard substrate may comprise a number of additional marks $P_8$, $P_9$, $P_{10}$, $P_{11}$, $P_{12}$, $P_{13}$ for aligning this substrate as a whole. Moreover, a number of marks Ps arranged in a cross along the X and Y axes may be present which are used to measure the flatness of the mirrors on the sides of the substrate table WT.

In the embodiment of FIG. 4 the reference plate RP has three marks $P_3$, $P_4$ and $P_5$ which correspond to three marks $M_3$, $M_4$ and $M_5$ of a production mask or of a reference mask which is provided in the projection apparatus during the image detection procedure. During this procedure the projection beam PB is switched on, which beam illuminates the reference mask. This mask is imaged by a projection lens system PL on a reference plate portion (SWa in FIG. 6) whose dimensions correspond to those of the portions of a production substrate which are illuminated in successive steps of the production illumination procedure. The marks $M_3$, $M_4$ and $M_5$ are imaged on the marks $P_3$, $P_4$ and $P_5$, respectively.

According to the invention the marks $P_3$, $P_4$ and $P_5$ are phase gratings and the marks $M_3$, $M_4$ and $M_5$ are amplitude gratings, the ratio between the grating period of the gratings $M_3$, $M_4$ and $M_5$ on the one hand and that of the gratings $P_3$, $P_4$ and $P_5$ on the other hand being equal to the magnification, for example $5^1$ of the projection lens system.

Figure 7A:
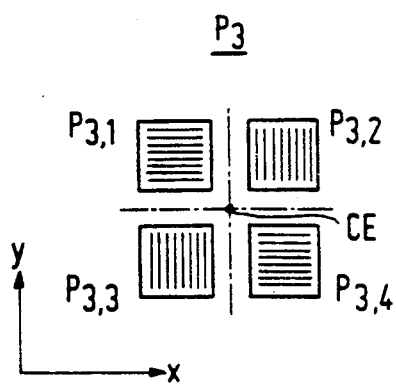
FIG. 7a shows an embodiment of a reference plate grating mark in a plan view.

FIG. 7a shows one of the reference plate gratings $P_3$ in a plan view. In principle, this grating comprises two portions whose grating strips extend in the X direction and the Y direction, respectively. The corresponding grating $M_3$ in the reference mask has of course the same geometry. The gratings $P_3$ and $M_3$ preferably comprise four grating portions, $P_{3,1}$, $P_{3,2}$, $P_{3,3}$ and $P_{3,4}$ for the grating $P_3$, which are located symmetrically around the centre CE of the grating $P_3$. Measuring errors, if any, can be minimized thereby.

Figure 7B:
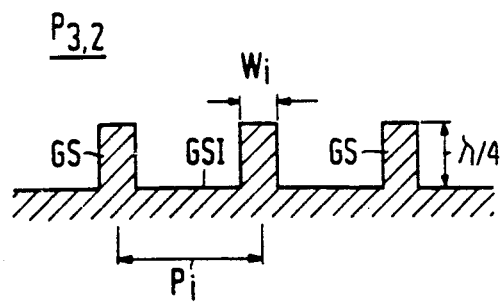
FIG. 7b shows a portion of said grating mark in a cross-section.

FIG. 7b shows a part of the grating portion $P_{3,2}$ with grating strips GS and intermediate strips GSI in a cross-section. This grating has a period Pi. The height h of the grating strips is preferably $\lambda/4$, in which $\lambda$ is the wavelength of the projection beam, so as to obtain a maximum contrast in the grating images. For a grating mark suitable for two wavelengths $\lambda_1$ and $\lambda_2$, the height h has a value of between $\frac{1}{4}\lambda_1$ and $\frac{1}{4}\lambda_2$. The gratings $P_4$ and $P_5$ have the same shape as is shown in FIGS. 7a and 7b and the same grating period, grating strip width and grating strip height as the grating $P_3$.

Figure 8:
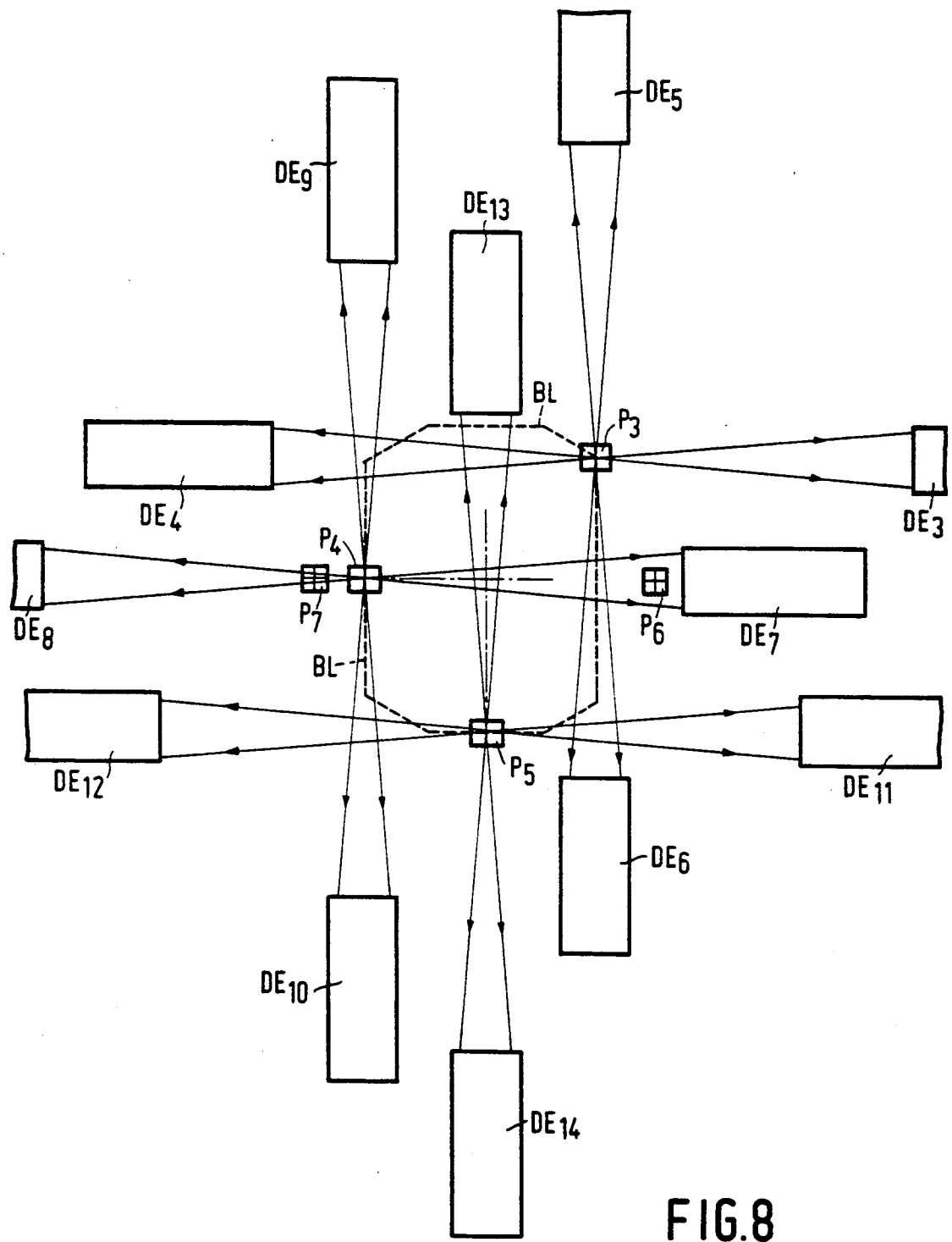
FIG. 8 shows diagrammatically reference plate grating marks and the associated detection systems.

The projection beam portions incident on the gratings $P_3$, $P_4$ and $P_5$ are already divided into a number of diffraction orders by the mask gratings $M_3$, $M_4$ and $M_5$. The reflecting gratings $P_3$, $P_4$ and $P_5$ in their turn divide each one of the different order beams into further sub-beams. These subdivisions are effected both in the X direction and in the Y direction. All combination orders (a, b)x, (a, )y unequal to (0,0), in which a is the order of a mask grating and b is the order of a reference plate grating, comprise information about the extent of alignment in the X direction and the Y direction, respectively, of the associated reference plate grating with respect to the corresponding reference plate mask grating, and information about a deviation of the Z position of the reference plate grating with respect to the ideal focusing plane. According to the invention there is a separate detection system for each grating portion. The twelve detection systems are shown in FIG. 8, which Figure shows the gratings $P_3$, $P_4$ and $P_5$ in a plan view. These gratings are preferably located on the edge of the image field of the projection lens system, which edge is denoted by the broken line BL, because then the image magnification and the image rotation can be measured in an optimum way. Furthermore FIG. 8 shows two grating marks $P_6$ and $P_7$ for the purpose of orientation, which marks are used to align an area of a production substrate on which one mask image is formed. The detection systems are denoted by $DE_3 \ldots$ to $DE_{14}$, the detection systems $DE_3$, $DE_4$, $DE_5$ and $DE_6$ being associated with the grating $P_3$ and used for receiving radiation deflected in the $+X$, $-X$, $+Y$ and $-Y$ directions, respectively. Analogously, the detection systems $D_7$–$D_{10}$ are associated with the grating $P_4$ and the detection systems $D_{11}$–$D_{14}$ are associated with the grating $P_5$.

Figure 9:
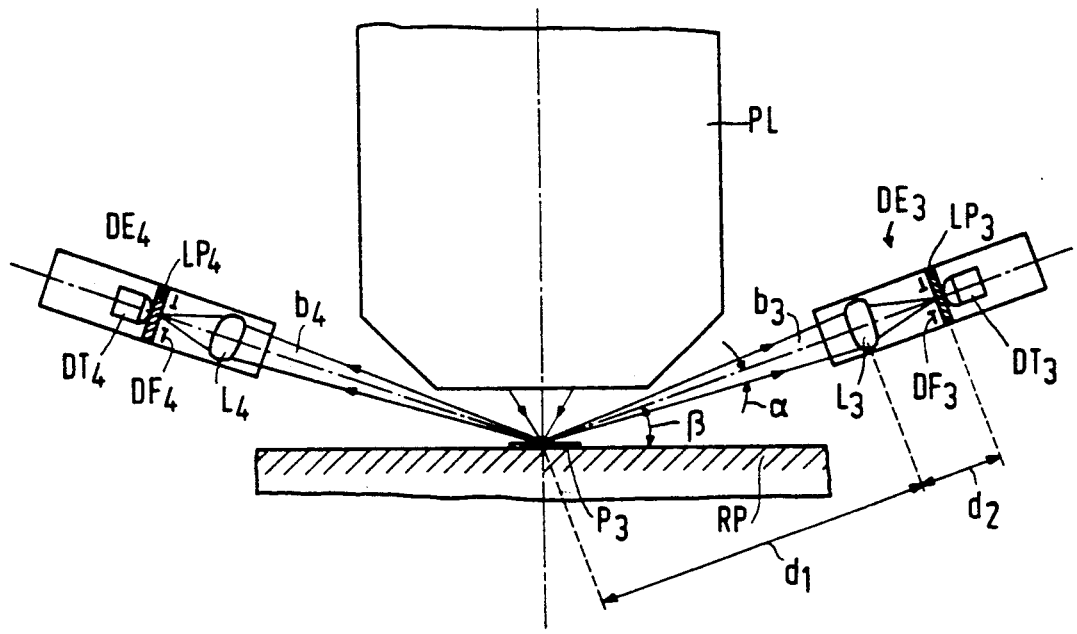
FIG. 9 shows details of the radiation-sensitive detection systems.

FIG. 9 shows the two detection systems associated with one grating, for example, the grating $P_3$ for one direction, for example, the X direction. The two detection systems for the other direction, the Y direction and the four detection systems for each of the two other gratings are identical to those of FIG. 9. According to the invention the detection systems not only comprise radiation-sensitive detectors, for example, photodiodes $DT_3$ and $DT_4$, but also lens systems $L_3$ and $L_4$ which are illustrated by means of a single lens element for the sake of simplicity. A diaphragm plate $DF_3$, $DF_4$, respectively, is arranged in front of a detector. It has been ensured that the image of the grating $P_3$ formed by the lens $L_3$ exactly covers the radiation-sensitive surface of the detector $DT_3$. The diaphragm plate $DF_3$ ensures that radiation from the ambience of the grating does not reach the detector $DT_3$. It is thereby achieved that the output signal of the detector $DT_3$ has a satisfactory signal-to-noise ratio. This detection method differs from that which is used in the image detection devices described in the articles: SPIE, Vol. 633, Optical Microlithography V (1986), pp. 106–112 and SPIE, Vol. 922, Laser Microlithography (1988), pp. 366–375 in which known devices radiation is diffusely scattered by the reference plate and in which one detector can receive radiation originating from the entire image field of the projection lens system.

The angle $\beta$ between the plane of the reference plate and the chief ray of the beam $b_3$ which is captured by the detector $DT_3$ is determined by the available space between the projection lens and the substrate table. In one embodiment of the image detection device this angle is of the order of 12°. The aperture $(\sin\alpha)$ of the beam $b_3$ is approximately 0.05. The lens $L_3$ has a magnification of approximately $\frac{1}{4}$ and a focal length of approximately 10 mm and a diameter of approximately 5 mm. The distance $d_1$ between the centre of the grating $P_3$ and the first main plane of the lens $L_3$ is approximately 50 mm and the distance $d_2$ between the second main plane of the lens and the detector is approximately 12.5 mm.

The sub-beams of different diffraction orders formed by the reflecting grating $P_3$ leave the grating at different angles to the normal on the grating plane, a larger deflection angle being associated with a higher diffraction order.

Since the detection system $DE_3$ has a small aperture, it must be ensured that a maximum possible quantity of radiation is reflected within an angle of between $(\beta - \frac{1}{2}\alpha)$ and $(\beta + \frac{1}{2}\alpha)$. More than one diffraction order may then enter the detection system. The quantity of radiation on the detector $DT_3$ can be maximized by a suitable choice of the grating parameters, while taking the wavelength of the projection beam into account. These grating parameters are:

the grating period Pi
the ratio Wi/Pi
the depth or height h of the grating strips GS
and the shape of the grating strips.

Figure 10:
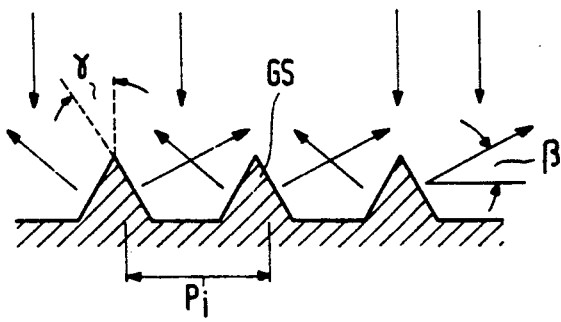
FIG. 10 shows a portion of another embodiment of a reference plate grating mark in a cross-section.

One way of achieving this is adaptation of the shape of the grating strips, e.g., by tilting that the walls of these strips at such an angle $\gamma$ that these walls reflect the radiation at an angle $\beta$ or an angle approximating the angle $\beta$, as is shown in FIG. 10. Instead of, or in combination with, the wall steepness of the grating strips, the other grating parameters can be chosen to be such that certain diffraction orders are diffracted at an angle $\beta$, while the intensity in these orders is amplified at the expense of the intensity in the other orders.

One of the other grating parameters which also determines the angle at which the radiation is diffracted is the grating period: the smaller the grating period, the larger the angles between the normal on the grating plane and the chief rays of the different diffraction orders. According to the invention, the grating period is adapted to the size of the details (line widths) of the image which must be projected by the projection lens system during the production illumination. Since the different image parameters are now determined by means of reference objects which correspond to a great extent to the production objects, these measurements are very accurate and reliable. Once the grating period has been determined by means of the above-mentioned adaptation, the desired diffraction at the angle $\beta$ can be realized by a suitable choice of the other grating parameters. In one embodiment of the image detection device in which the angle $\beta$ is approximately 12° and the lens $L_3$ has a focal length of approximately 10 mm and an aperture of approximately 0.05, the grating has straight grating strips with a period Pi of approximately 0.84 $\mu$m and a grating strip width of approximately 0.21 $\mu$m. This grating has the advantage that it can be used both at a wavelength of 365 nm and at a wavelength of 248 nm for the projection beam. At a wavelength of 365 nm the radiation diffracted in the (+1, +1) and (0, +2) orders reaches the detector. At a wavelength of 248 nm it is the radiation diffracted in the (0, +3), (−1, +4), (+1, +2), (0, +4) and (+1, +3) orders.

Particularly when very short-wave length radiation, such as deep ultraviolet radiation with a wavelength of 248 nm, is used, the known radiation-sensitive detectors such as photodiodes are not readily suitable for use in the image detection device. Detectors which are particularly sensitive to this type of radiation and which have a low sensitivity should then be used. According to the invention, a luminescent plate $LP_3$, $LP_4$ is arranged in each detection system $DE_3$, $DE_4$, which plate converts the short-wave projection radiation into radiation of a longer wavelength to which the conventional detectors are sensitive.

Figure 11:
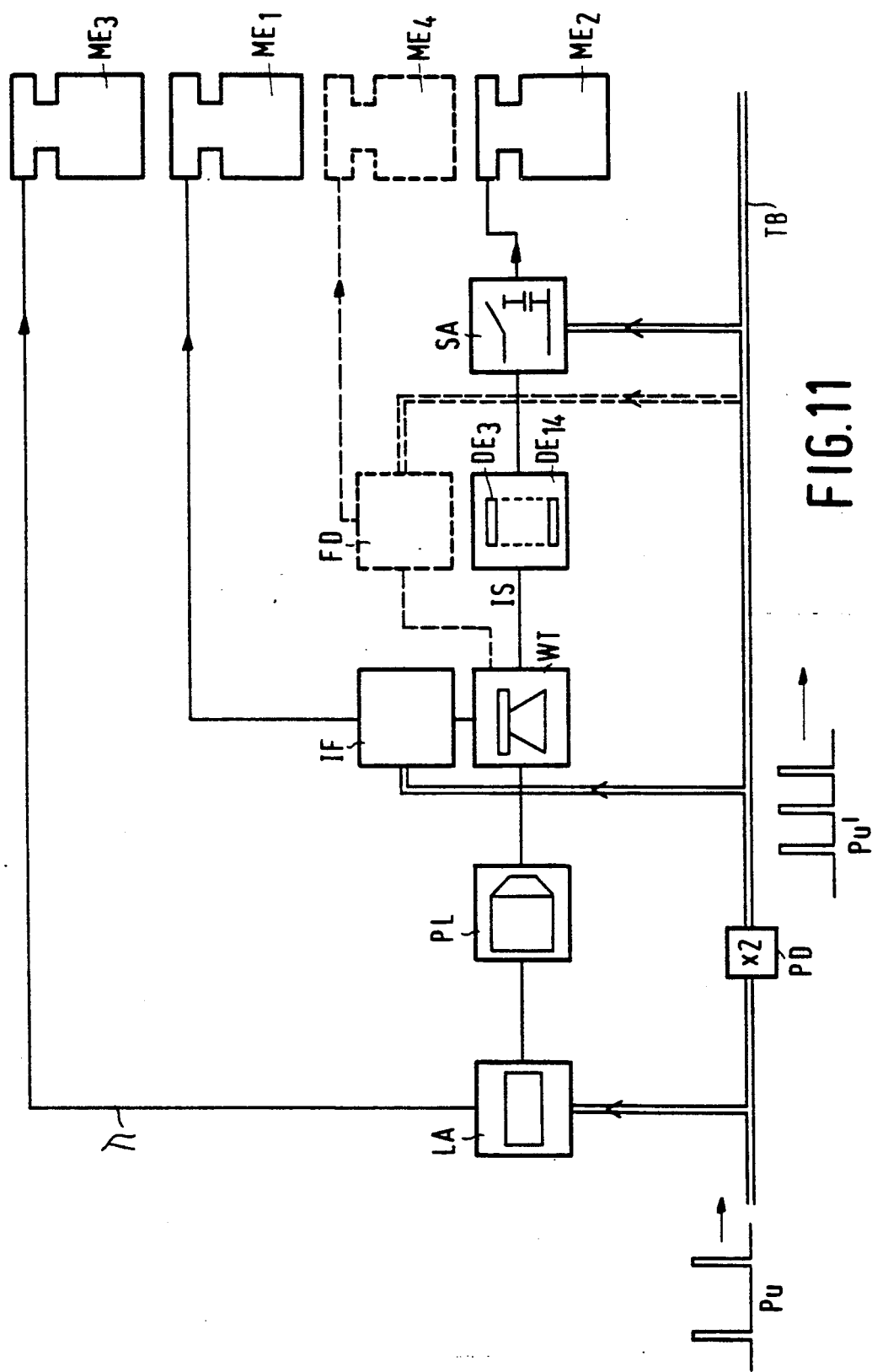
FIG. 11 shows the synchronization circuit of the different detection devices of a projection apparatus in which a pulsed projection beam is used.

Another aspect of the short-wave-length projection radiation is that it is supplied by a pulsed laser, such as a Krypton-Fluoride laser so that it must be ensured for the sake of reliability that measurements only take place during the short radiation pulses having a pulse duration of, for example 20 msec. According to the invention, an electronic synchronization of the projection laser pulse and the measurements is brought about in the projection apparatus. FIG. 11 shows the principle of this synchronization. The reference TB denotes a bus along which a series of pulses Pu is passed during the image detection procedure. These pulses are applied to the laser LA so as to ignite this laser so that it sends short radiation pulses to the reference plate on the substrate table WT VIA the projection lens system PL and the reference mask. The line marked λ indicates that the values measured by a wavelength measuring device, which is coupled to the laser, are passed on to and stored in a memory $ME_3$ of a computer, which computer processes all measuring signals. After the number of pulses per unit of time has been doubled in the device PD, these pulses are applied to the substrate table position detection device IF so as to ensure that only the positions and orientations measured during the pulse periods are passed on to and stored in a second memory $ME_1$ of the computer. The device IF determines both the X, Y and Z positions of the substrate table and the reference plate on this table, and its rotation $O_2$ about the Z axis. However, the Z position can also be supplied by a focus error detection device FD to which the pulses Pu are applied so that the Z values measured during the pulse periods are passed on to and stored in a memory $ME_4$ of the computer. The signals of the image detection device IS comprising the detection systems $DE_3 \ldots DE_{14}$ are applied to a pulse-controlled sample-and-hold circuit SA so that signals from the device IS are passed on to and stored in a memory $ME_2$ of the central computer only during the pulse periods.

At the pulse frequencies and pulse periods used, DC— instead of AC-coupled amplifiers should be used for the signal processing. In order to raise the signal-to-noise ratio, the laser radiation is preferably also measured in the time intervals between the pulses Pu and the measuring values in the pulse periods are compared with those in the time intervals between the pulses.

Since signals are only received during the pulse periods in the image detection procedure when the reference plate marks are moved so as to determine the optimum alignment positions, the signals obtained are independent of inaccuracies of the X, Y, Z, $\phi_2$ detection devices and servo systems.

The signals supplied by these devices comprise information about the X, Y and Z positions of three reference plate marks and three mask marks, so that a total of twelve degrees of freedom is measured.

Since all detection devices simultaneously measure on the same reference plate, these devices are coupled together.

Figure 12:
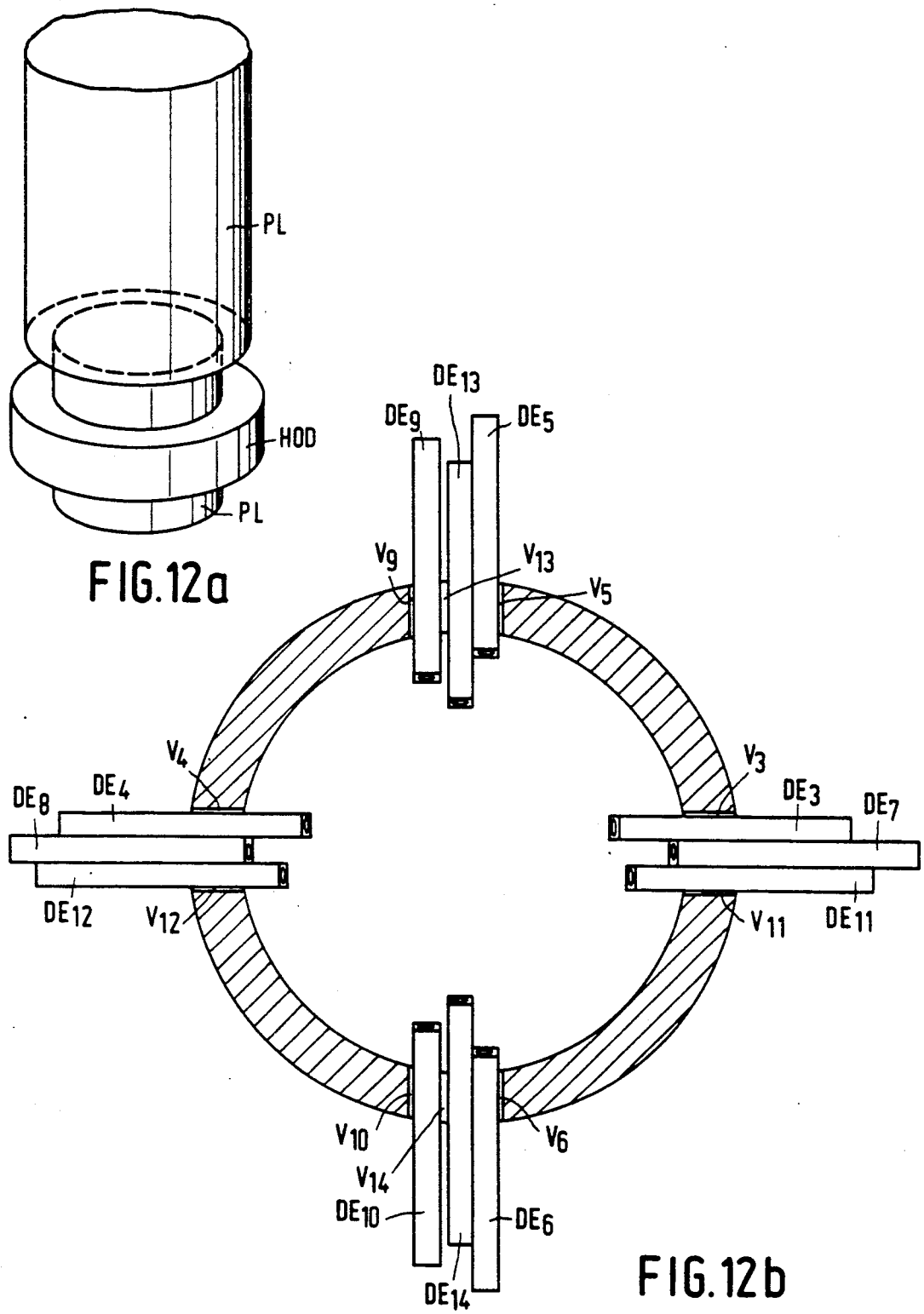
FIGS. 12a and 12b show an annular holder for the detection systems of the image detection device.

The detection systems $DE_3 \ldots DE_{14}$ are preferably arranged in an annular holder HOD which is secured to the lower part of the projection lens system PL, as is shown in FIG. 12a. FIG. 12b is a cross-section of this holder. The holder may be a solid body in which recesses $V_3 \ldots V_{14}$ are present at accurately determined positions and which have an accurately determined shape and size. If the detection systems are inserted into this holder, they have already been aligned to a great extent and they need not be corrected or only corrected to a small extent during assembly of the projection apparatus.

When using three two-dimensional grating marks on the reference plate and on the mask and four detectors for each grating mark, twelve apparatus parameters, or degrees of freedom can in principle be measured. In practice, nine parameters in the projection apparatus are important so that there is a given redundance in the measurements. The parameters which are measured are the position of an image formed by the projection lens system with projection radiation in the X, Y and Z directions, and the rotation of this image about the X, Y and Z axes. These positions and rotations are measured with respect to the substrate table, while the system of coordinates defined by the substrate table position detection device constitutes a reference for the image detection device. The rotation about the Z axis is the rotation of the image in its own plane. The rotations about the X axis and the Y axis represent the tilt of the image along the Y axis and the X axis, respectively.

The information about the tilt of the image formed with projection light, which information is supplied by the image detection device, can be used to calibrate a tilt detection device, which device operates with radiation other than projection radiation and whose operation is based on the autocollimator principle.

In addition to information about the position, the rotation and the tilt of the image, the image detection device also supplies information about the changes in image quality, notably magnification, astigmatism and third-order distortion occurring due to variations in the wavelength of the projection beam and variations of the ambient parameters such as air pressure, temperature and the like. Moreover, the curvature of the field can be derived from the astigmatism because the changes in astigmatism and curvature of the field occurring due to varying ambient parameters have a fixed relationship.

The signal of the detector $DT_3$ comprises information about the X position of the image of the mask mark $M_3$ with respect to the reference plate mark $P_3$, but also information about the Z position of this image. No independent X and Z position signals can be obtained with the single detector $D_3$. Since in the signal of the detector $DT_4$ the contribution which is dependent on the Z position (or the contribution which is dependent on the X position) has a different sign than this contribution in the signal of the detector $DT_3$, while the contribution which is dependent on the X position (or the contribution which is dependent on the Z position) in the two signals has the same sign, independent information about the X position (or Z position) can be obtained by adding the two detector signals and independent information about the Z position (or X position) can be obtained by subtracting the two detector signals. To determine the X position of the image of the mask mark $M_3$, the reference plate is moved in the X direction at a constant Z and the intensity of the radiation on the detector $DT_3$ is measured as a function of the movement. By comparing the phase of the intensity-versus-movement curve thus obtained with a reference curve, the X position is obtained. To determine the focusing (Z position), the reference plate is moved in the Z direction at a constant X and the intensity is again measured as a function of the movement. Also the intensity-versus-movement curve thus obtained is compared with a reference from which the Z position, $Z_{3,x}$ follows. $Z_{3,x}$ provides information about the focusing error at the location of the mark $P_3$ in the X direction. Analogously, the position signal $Y_3$ and the focus error signal $Z_{3,y}$ can be obtained from the signals of the detectors $DT_5$ and $DT_6$. The X and Y positions of the image of the mask mark $M_3$ are then known, as well as the focusing error in the X and Y direction at the location of the reference plate mark $P_3$, hence also the astigmatism of the image.

In the same way the position signals $X_4$ and $Y_4$ and the focus error signals $Z_{4,x}$ and $Z_{4,y}$ can be obtained from the signals of the detectors $DT_7$, $DT_8$, $DT_9$ and $DT_{10}$ associated with the reference plate mark $P_4$, while the position signals $X_5$ and $Y_5$ and the focus error signals $Z_{5,x}$ and $Z_{5,y}$ are derived from the signals of the detectors $DT_{11}$, $DT_{12}$, $DT_{13}$ and $DT_{14}$ associated with the mark $P_5$. Since the X, Y and Z positions of three marks in the image are then known, the X, Y and Z positions $P_{T,x}$, $P_{T,y}$ and $P_{T,z}$ of the total image formed by the projection lens system with projection radiation are also known.

It is to be noted that in principle $P_{T,x}$, $P_{T,y}$ and $P_{T,z}$ may also be determined only by the signals of the four detectors, for example, $DT_3$, $DT_4$, $DT_5$ and $DT_6$ associated with one grating mark, for example, $P_3$. These detectors also provide information about the astigmatism $AS_T$ of the entire image. This position information is not as accurate as the information which is obtained when measuring on three marks, but under certain circumstances it is satisfactorily usable.

When the positions of the images of the three mask marks with respect to the associated reference plate marks are known, the tilt of the image plane $\phi_x$ and $\phi_y$, i.e. the plane through the three mask mark images about the X and the Y axes can be determined by comparing the three image positions in the X and Y directions, respectively.

Rotation of the projection image about the Z axis results in opposite variations in the X and Y positions of the different mask mark images. The image rotation can therefore be determined by comparing the X and Y positions of the mask mark images.

In the case of a magnification error Me in the X and Y directions respectively, the image of a first mask mark, for example, $M_3$ is moved in the opposite sense in the X direction and the Y direction, respectively, with respect to the image of a second mask mark, for example, $M_4$. The magnification error can be determined by comparing these position shifts in the X and Y directions.

The third-order distortion, or radial distortion $D_3$ may be determined by comparing all position information of the three marks, if the three reference plate marks are located at different distances from the optical axis of the projection lens system PL. If the marks are located at equal distances from the optical axis, the third-order distortion can be determined by using the information of the substrate table position detection device as a reference.

It is to be noted that it has been shown hereinbefore that the nine relevant parameters $X_T$, $Y_T$, $Z_T$, $\phi_x$, $\phi_y$, $\phi_z$, Me, AS and $D_3$ can indeed be measured. The processing of the detector signals themselves may be carried out in various manners in practice, using a central computer which compares the detector signals with reference values. So-called curve fitting procedures are then preferably used, comparing measured signal curves with reference curves stored in the computer. The result of this comparison yields control signals for the various servo devices of the projection apparatus. It is then not necessary for all parameters influencing the projection quality, i.e. the ambient parameters, the wavelength of the projection beam, the mechanical drift etc. to be precisely known, but from the detector signals the computer can ascertain that the image formed by the projection lens system is not correct and then generate adjusting signals for the various servo devices and control signals for the apparatus parameters such as the wavelength, the gas pressure and temperature, Etc., in the projection lens via a model in which all influencing parameters are incorporated, so that the position and quality of the projected image is optimized.

As compared with known image detection devices, the detection device according to the present invention provides, inter alia, the following advantages:

by simultaneously measuring at three different points of the image field and in the X and Y directions, the measuring time is reduced by a factor of six, while the accuracy of the parameters such as X and Y positions and astigmatism which are measured a number of times, is enhanced by means of averaging, and the measurements of parameters such as image rotation, magnification and third-order distortion, which measurements must be effected at a number of points in the image field, are not affected by inaccuracies of the substrate table position detection device, the wavelength measuring device and the focus error detection device;

since each grating mark of the reference plate is accurately imaged on the associated detectors, all radiation diffracted in the correct direction is received, while radiation from the ambience of such a grating is not received, so that the signal-to-noise ratio is better than in detection devices in which diffusely scattered radiation is used, and moreover it is possible to measure simultaneously on a plurality of gratings, because each detector only receives radiation from the associated grating.

since two detectors are provided for each grating mark and for each direction X and Y, and a coherent detection is performed, the influence of intensity variations of the projection beam on the measurements can be ignored.

A further important advantage of the image detection device according to the invention is that it is not only possible to measure and correct more rapidly but also more accurately. In a projection apparatus with a projection beam whose wavelength is in the far ultraviolet range, for example, 248 nm, it should be possible to measure instabilities of the order of 5 nm in the X and Y directions and instabilities of the order of 50 nm in the Z direction. In a projection apparatus in which the influencing parameters themselves were measured and compared with reference values, the temperature, the wavelength, the Z position of the mask and the air pressure would have to be measured with an accuracy of 0.015° K, 0.5 pm, 0.15 µm and 0.5 mbar, respectively. If it is at all possible to achieve these measuring accuracies, very sophisticated measuring techniques need be used for this purpose. Moreover, the measured values should be converted into aberrations of the projection lens system, whereby it is moreover required that no inhomogeneities occur in this system. Moreover, mechanical drift in the projection apparatus has not been taken into account.

Figure 13:
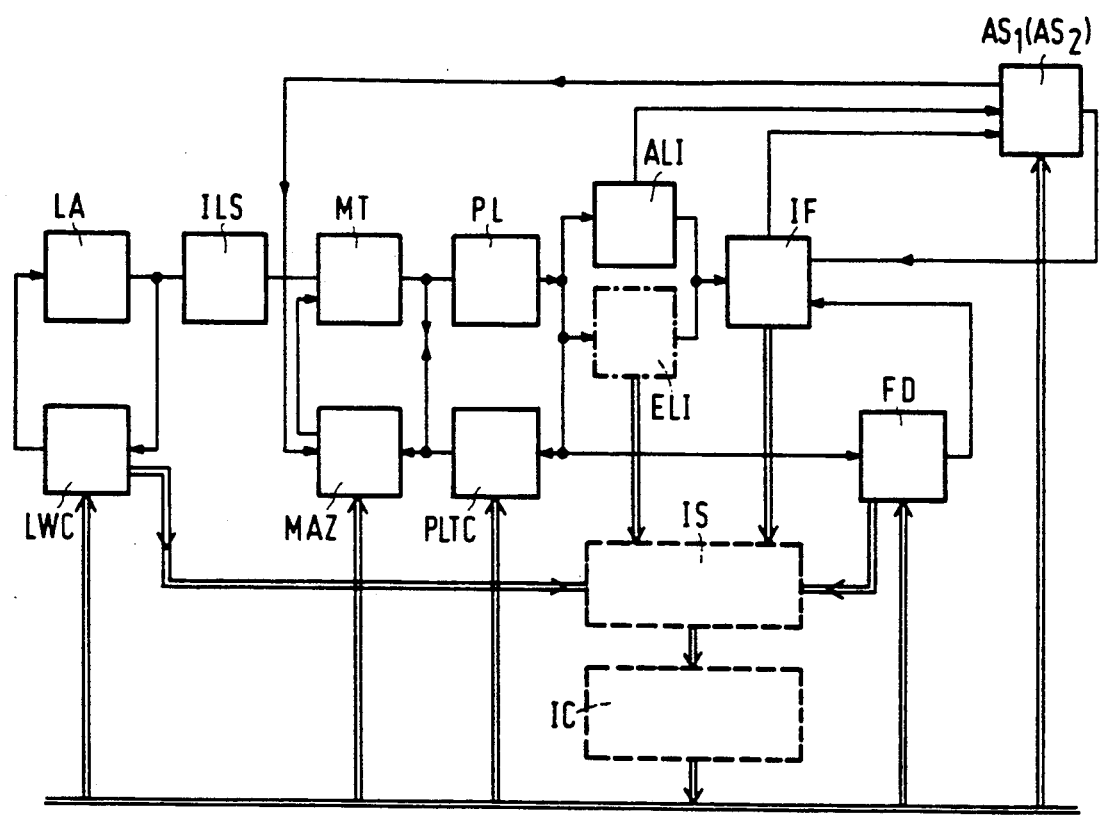
FIG. 13 shows a circuit diagram of the different servo devices of the projection apparatus and the couplings between these devices.

FIG. 13 shows diagrammatically the servo devices (denoted by boxes) and their couplings used in the projection apparatus of the invention. These boxes represent:

LA, the radiation source, for example, a laser,
LWC, a laser wavelength controlling device,
ILS, the illumination system,
MT, the mask table,
MAZ, a device checking the Z position of the mask table,
PL, the projection lens,
PLTC, a device controlling the temperature of the projection lens,
ALI, the image formed with alignment radiation,
IF, the substrate table position detection device,
FD, the focus error detection device,
$AS_1$ ($AS_2$), the single (or double) alignment device.

The extra sub-systems arranged in the projection apparatus and denoted by broken lines are:

ELI, the image formed by means of the projection radiation,
IS, the image detection device, and
IC, the image calibration device, or the computer.

The single connection lines between the different devices are also present in known projection apparatuses. The double connection lines indicate the extra signals which are processed when using the image detection device IS and the image calibration device IC.

The signals applied to the image detection device IS are:

the signals of the substrate table position detection device IF, the wavelength monitoring device LWC and the focus error detection device FD,
the image information of the image formed by means of projection radiation ELT.

Signals of the image calibration device IC are applied to:

the laser wavelength controlling device LWC
the mask height checking device MAZ
the projection lens temperature control device PLTC
the focus error detection device, and
the alignment device $AS_1$ ($AS_2$).

The projection apparatus may comprise one or more of the following devices:

a device for controlling the pressure in the projection lens system,
a device for controlling the composition of the medium in the projection lens system,
a device for controlling the mutual distances between the lens elements.

These devices would be controlled from the device IC, analogously as the device PLTC.

We claim:

1. A method of projecting a mask pattern onto a substrate by means of a projection lens system and a projection beam, the mask pattern provided in a mask table and the substrate provided in a substrate table, which method comprises the following steps:

providing a mask having mask reference marks in the mask table,
providing a reference plate having reference plate marks in the projection beam on the substrate table,
projecting the image of at least one mark of the mask on a corresponding mark of the reference plate by means of the projection beam and the projection lens system,
detecting projection radiation from the illuminated reference plate mark by means of radiation-sensitive image detectors,
electronically processing the detector signals to an alignment calibration signal and a magnification error signal,
adjusting an alignment device and setting the magnification of the projection lens system by means of the respective signals,
removing the reference plate from the substrate table and providing a production substrate on the table, and
repetitively projecting a production mask successively in different positions on the production substrate, characterized in that simultaneously with the signals of the image detection device also signals of a substrate table position detection device and of an optical focus error detection device are electronically processed, in that a plurality of image detectors is used for each reference plate mark, in that said detectors only receive radiation from an associated reference plate mark, and in that the signals of the image detection device, of the substrate table position detection device and of the optical focus error detection device are also processed to a calibration signal for the focus error detection device and to at least one control signal with which at least one of the parameters influencing the image quality is adjusted.

2. A method as claimed in claim 1, characterized in that use is made of at least three two-dimensional grating reference plate marks, a corresponding number of analogous mask marks and four image detection detectors per reference plate mark.

3. A method as claimed in claim 2, characterized in that use is made of a separate, reference plate made of a material selected from the group consisting of quartz, glass and Zerodur, with grating marks integrated therein, and in that after measuring and setting a first projection apparatus said reference plate is used for measuring and setting a second and possible subsequent projection apparatuses.

4. A method as claimed in claim 2, characterized in that the reference plate has the size of a production substrate and has a plurality of groups of at least three grating marks, each group being located within an area having the size of the image field of the projection lens system.

5. A method as claimed in claim 1, characterized in that use is made of a separate, reference plate made of material selected from the group consisting of quartz, glass and Zerodur, with grating marks integrated therein, and in that after measuring and setting a first projection apparatus said reference plate is used for measuring and setting a second and possible subsequent projection apparatuses.

6. A method as claimed in claim 5, characterized in that the reference plate has the size of a production substrate and has a plurality of groups of at least three grating marks, each group being located within an area having the size of the image field of the projection lens system.

7. A method as claimed in claim 5, in which the projection beam is a pulsed radiation source, characterized in that a series of synchronization pulses is used during the measurement, each pulse simultaneously igniting the source and sampling the signals of the substrate table position detection device, of the image detection device and of the focus error detection device.

8. A method as claimed in claim 1, in which the projection beam is a pulsed radiation source, characterized in that a series of synchronization pulses is used during the measurement, each pulse simultaneously igniting the source and sampling the signals of the substrate table position detection device, of the image detection device and of the focus error detection device.

9. A method as claimed in claim 8, characterized in that the reference plate has the size of a production substrate and has a plurality of groups of at least three grating marks, each group being located within an area having the size of the image field of the projection lens system.

10. A method as claimed in claim 8, characterized in that the wavelength of the projection beam is measured for each pulse and is processed together with other measuring signals.

11. A method as claimed in claim 10, characterized in that the reference plate has the size of a production substrate and has a plurality of groups of at least three grating marks, each group being located within an area having the size of the image field of the projection lens system.

12. A method as claimed in claim 1, characterized in that the reference plate has the size of a production substrate and having a plurality of groups of at least three grating marks, each group being located within an area having the size of the image field of the projection lens system.

13. A reference plate intended for use with the method as claimed in claim 1, characterized in that one reference mark in the form of a two-dimensional grating is integrated into the plate.

14. A reference plate as claimed in claim 13, characterized in that the plate is made of a material selected from the group consisting of quartz, glass and Zerodur, and in that at least three reference marks in the form of two-dimensional gratings are integrated in the plate.

15. A reference plate as claimed in claim 14, characterized by a size corresponding to the size of a production substrate and by a plurality of groups of two-dimensional marks, each group being present within a separate area of the reference plate corresponding to an area on the production substrate which is intended to receive one image of a production mask pattern.

16. An apparatus for projecting a mask pattern on a substrate, which apparatus comprises an illumination system for supplying a projection beam, a mask table, a projection lens system and a substrate table, and which further comprises an alignment device and a magnification setting device for aligning the mask and the substrate with respect to each other for setting the magnification with which the mask pattern is imaged on the substrate, and an image detection device for checking, prior to a production projection process, a mask image formed by means of the projection lens system and the projection beam, said image detection device comprising a reference plate having at least one mark on which the image of a corresponding mark of the mask is formed and a radiation-sensitive detection system for converting projection radiation originating from at least one reference plate mark into electric signals, characterized in that the reference plate marks are formed by two-dimensional grating marks whose grating strips extend in the X and Y directions of an X, Y, Z system of coordinates whose Z axis is parallel to the optical axis of the projection lens system: in that for each grating mark four radiation-sensitive detectors are present for receiving the radiation deflected by the relevant grating mark, and in that a lens system for projecting only the relevant grating mark on the relevant detector is arranged between each grating mark and each associated detector.

17. An apparatus as claimed in claim 16, characterized in that each reference plate grating mark comprises two grating portions whose grating strips have a first direction and two grating portions whose grating strips have a second direction perpendicular to the first direction, and in that the four grating portions are located symmetrically around the centre of the grating.

18. An apparatus as claimed in claim 17, characterized in that the period of each grating mark is substantially equal to the resolving power of the projection lens system.

19. An apparatus as claimed in claim 17, characterized in that the grating parameters of each grating mark are adapted to the position and numerical aperture of the associated lens systems so that a maximum quantity of radiation of the relevant grating mark is captured by the associated detectors.

20. An apparatus as claimed in claim 17, characterized in that the reference plate gratings are phase gratings.

21. An apparatus as claimed in claim 17, characterized in that the grating parameters are optimized for two different wavelengths of the projection beam.

22. An apparatus as claimed in claim 17, characterized in that the grating marks are reflective.

23. A apparatus as claimed in claim 17, characterized in that the different sets of four detectors are associated with different areas in the image field of the projection lens system, the centres of said areas being located at different distances from the centre of the image field.

24. An apparatus as claimed in claim 17, characterized in that each detector is preceded by a luminescent plate which converts the projection radiation into radiation to which the detector is sensitive.

25. An apparatus as claimed in claim 17, characterized in that the reference plate is coupled via the production substrate table to a position detection device for detecting positions along at least two mutually perpendicular axes and rotations about said axes, and in that the signal outputs of said device, of the image detection device, of the alignment device and of a focus error detection device are connected to the inputs of an electronic signal processing device which supplies control signals for correcting one or more of the following parameters:

the wavelength of the projection beam
the pressure within the projections lens holder
the mutual distances between the lens elements of the projection lens system the composition of the medium in one or more the compartments of the projection lens holder
the temperature within the projection lens holder
the zero-setting of the alignment device
the zero-setting of the focusing device
the magnification of the projection lens system.

26. An apparatus as claimed in claim 16, characterized in that the period of each grating mark is substantially equal to the resolving power of the projection lens system.

27. An apparatus as claimed in claim 26, characterized in that the grating parameters of each grating mark are adapted to the position and numerical aperture of the associated lens systems so that a maximum quantity of radiation of the relevant grating mark is captured by the associated detectors.

28. An apparatus as claimed in claim 26, characterized in that the reference plate gratings are phase gratings.

29. An apparatus as claimed in claim 26, characterized in that the grating parameters are optimized for two different wavelengths of the projection beam.

30. An apparatus as claimed in claim 26, characterized in that the grating marks are reflective.

31. A apparatus as claimed in claim 26, characterized in that the different sets of four detectors are associated with different areas in the image field of the projection lens system, the centres of said areas being located at different distances from the centre of the image field.

32. An apparatus as claimed in claim 26, characterized in that each detector is preceded by a liminescent plate which converts the projection radiation into radiation to which the detector is sensitive.

33. An apparatus as claimed in claim 26, characterized in that the reference plate is coupled via the production substrate table to a position detection device for detecting positions along at least two mutually perpendicular axes and rotations about said axes, and in that the signal outputs of said device, of the image detection device, of the alignment device and of a focus error detection device are connected to the inputs of an electronic signal processing device which supplies control signals for correcting one or more of the following parameters:
the wavelength of the projection beam
the pressure within the projections lens holder
the mutual distances between the lens elements of the projection lens system
the composition of the medium in one or more the compartments of the projection lens holder
the temperature within the projection lens holder
the zero-setting of the alignment device
the zero-setting of the focusing device
the magnification of the projection lens system.

34. An apparatus as claimed in claim 16, characterized in that the grating parameters of each grating mark are adapted to the position and numerical aperture of the associated lens systems so that a maximum quantity of radiation of the relevant grating mark is captured by the associated detectors.

35. An apparatus as claimed in claim 34, characterized in that the reference plate gratings are phase gratings.

36. An apparatus as claimed in claim 34, characterized in that the grating parameters are optimized for two different wavelengths of the projection beam.

37. An apparatus as claimed in claim 34, characterized in that the grating marks are reflective.

38. A apparatus as claimed in claim 34, characterized in that the different sets of four detectors are associated with different areas in the image field of the projection lens system, the centres of said areas being located at different distances from the centre of the image field.

39. An apparatus as claimed in claim 34, characterized in that each detector is preceded by a luminescent plate which converts the projection radiation into radiation to which the detector is sensitive.

40. An apparatus as claimed in claim 34, characterized in that the reference plate is coupled via the production substrate table to a position detection device for detecting positions along at least two mutually perpendicular axes and rotations about said axes, and in that the signal outputs of said device, of the image detection device, of the alignment device and of a focus error detection device are connected to the inputs of an electronic signal processing device which supplies control signals for correcting one or more of the following parameters:
the wavelength of the projection beam
the pressure within the projections lens holder
the mutual distances between the lens elements of the projection lens system
the composition of the medium in one or more the compartments of the projection lens holder
the temperature within the projection lens holder
the zero-setting of the alignment device
the zero-setting of the focusing device
the magnification of the projection lens system.

41. An apparatus as claimed in claim 16, characterized in that the reference plate gratings are phase gratings.

42. An apparatus as claimed in claim 41, characterized in that the grating parameters are optimized for two different wavelengths of the projection beam.

43. An apparatus as claimed in claim 41, characterized in that the grating marks are reflective.

44. A apparatus as claimed in claim 41, characterized in that the different sets of four detectors are associated with different areas in the image field of the projection lens system, the centres of said areas being located at different distances from the centre of the image field.

45. An apparatus as claimed in claim 41, characterized in that each detector is preceded by a luminescent plate which converts the projection radiation into radiation to which the detector is sensitive.

46. An apparatus as claimed in claim 41, characterized in that the reference plate is coupled via the production substrate table to a position detection device for detecting positions along at least two mutually perpendicular axes and rotations about said axes, and in that the signal outputs of said device, of the image detection device, of the alignment device and of a focus error detection device are connected to the inputs of an electronic signal processing device which supplies control signals for correcting one or more of the following parameters:
the wavelength of the projection beam
the pressure within the projections lens holder
the mutual distances between the lens elements of the projection lens system
the composition of the medium in one or more the compartments of the projection lens holder
the temperature within the projection lens holder
the zero-setting of the alignment device
the zero-setting of the focusing device
the magnification of the projections lens system.

47. An apparatus as claimed in claim 16, characterized in that the grating parameters are optimized for two different wavelengths of the projection beam.

48. An apparatus as claimed in claim 47, characterized in that the grating marks are reflective.

49. A apparatus as claimed in claim 47, characterized in that the different sets of four detectors are associated with different areas in the image field of the projection lens system, the centres of said areas being located at different distances from the centre of the image field.

50. An apparatus as claimed in claim 47, characterized in that each detector is preceded by a luminescent plate which converts the projection radiation into radiation to which the detector is sensitive.

51. An apparatus as claimed in claim 47, characterized in that the reference plate is coupled via the production substrate table to a position detection device for detecting positions along at least two mutually perpendicular axes and rotations about said axes, and in that the signal outputs of said device, of the image detection device, of the alignment device and of a focus error detection device are connected to the inputs of an electronic signal processing device which supplies control signals for correcting one or more of the following parameters:
the wavelength of the projection beam
the pressure within the projections lens holder
the mutual distances between the lens elements of the projection lens system
the composition of the medium in one or more the compartments of the projection lens holder
the temperature within the projection lens holder
the zero-setting of the alignment device
the zero-setting of the focusing device
the magnification of the projection lens system.

52. An apparatus as claimed in claim 47, suitable for use with a projection beam wavelength of 365 nm and 248 nm, characterized in that the ratio between the grating groove width and the grating period is substantially ¼ and in that the grating period is approximately 0.84 μm.

53. An apparatus as claimed in claim 52, characterized in that the grating marks are reflective.

54. A apparatus as claimed in claim 52, characterized in that the different sets of four detectors are associated with different areas in the image field of the projection lens system, the centres of said areas being located at different distances from the centre of the image field.

55. An apparatus as claimed in claim 52, characterized in that each detector is preceded by a luminescent plate which converts the projection radiation into radiation to which the detector is sensitive.

56. An apparatus as claimed in claim 52, characterized in that the reference plate is coupled via the production substrate table to a position detection device for detecting positions along at least two mutually perpendicular axes and rotations about said axes, and in that the signal outputs of said device, of the image detection device, of the alignment device and of a focus error detection device are connected to the inputs of an electronic signal processing device which supplies control signals for correcting one or more of the following parameters:
the wavelength of the projection beam
the pressure within the projections lens holder
the mutual distances between the lens elements of the projection lens system
the composition of the medium in one or more the compartments of the projection lens holder
the temperature within the projection lens holder
the zero-setting of the alignment device
the zero-setting of the focusing device
the magnification of the projection lens system.

57. An apparatus as claimed in claim 16, characterized in that the grating marks are reflective.

58. A apparatus as claimed in claim 57, characterized in that the different sets of four detectors are associated with different areas in the image field of the projection lens. system, the centres of said area being located at different distances from the centre of the image field.

59. An apparatus as claimed in claim 57, characterized in that each detector is preceded by a luminescent plate which converts the projection radiation into radiation to which the detector is sensitive.

60. An apparatus as claimed in claim 57, characterized in that the reference plate is coupled via the production substrate table to a position detection device for detecting positions along at least two mutually perpendicular axes and rotations about said axes, and in that the signal outputs of said device, of the image detection device, of the alignment device and of a focus error detection device are connected to the inputs of an electronic signal processing device which supplies control signals for correcting one or more of the following parameters:
the wavelength of the projection beam
the pressure within the projections lens holder
the mutual distances between the lens elements of the projection lens system
the composition of the medium in one or more the compartments of the projection lens holder
the temperature within the projection lens holder
the zero-setting of the alignment device
the zero-setting of the focusing device
the magnification of the projection lens system.

61. An apparatus as claimed in claim 57, characterized in that all detectors associated with the image detection device, as well as the lens systems associated with said detectors are fixed in an annular holder which is connected to the projection lens system.

62. A apparatus as claimed in claim 61, characterized in that the different sets of four detectors are associated with different areas in the image field of the projection lens system, the centres of said areas being located at different distances from the centre of the image field.

63. An apparatus as claimed in claim 61, characterized in that each detector is preceded by a luminescent plate which converts the projection radiation into radiation to which the detector is sensitive.

64. An apparatus as claimed in claim 61, characterized in that the reference plate is coupled via the production substrate table to a position detection device for detecting positions along at least two mutually perpendicular axes and rotations about said axes, and in that the signal outputs of said device, of the image detection device, of the alignment device and of a focus error detection device are connected to the inputs of an electronic signal processing device which supplies control signals for correcting one or more of the following parameters:
the wavelength of the projection beam
the pressure within the projections lens holder
the mutual distances between the lens elements of the projection lens system the composition of the medium in one or more the compartments of the projection lens holder
the temperature within the projection lens holder
the zero-setting of the alignment device
the zero-setting of the focusing device
the magnification of the projection lens system.

65. An apparatus as claimed in claim 16, characterized in that the different sets of four detectors are associated with different areas in the image field of the projection lens system, the centres of said areas being located at different distances from the centre of the image field.

66. An apparatus as claimed in claim 65, characterized in that each detector is preceded by a luminescent plate which converts the projection radiation into radiation to which the detector is sensitive.

67. An apparatus as claimed in claim 65, characterized in that the reference plate is coupled via the production substrate table to a position detection device for detecting positions along at least two mutually perpendicular axes and rotations about said axes, and in that the signal outputs of said device, of the image detection device, of the alignment device and of a focus error detection device are connected to the inputs of an electronic signal processing device which supplies control signals for correcting one or more of the following parameters:
the wavelength of the projection beam
the pressure within the projections lens holder
the mutual distances between the lens elements of the projection lens system
the composition of the medium in one or more the compartments of the projection lens holder
the temperature within the projection lens holder
the zero-setting of the alignment device
the zero-setting of the focusing device
the magnification of the projection lens system.

68. An apparatus as claimed in claim 16, characterized in that each detector is preceded by a luminescent plate which converts the projection radiation into radiation to which the detector is sensitive.

69. An apparatus as claimed in claim 68, characterized in that the reference plate is coupled via the production substrate table to a position detection device for detecting positions along at least two mutually perpendicular axes and rotations about said axes, and in that the signal outputs of said device, of the image detection device, of the alignment device and of a focus error detection device are connected to the inputs of an electronic signal processing device which supplies control signals for correcting one or more of the following parameters:
the wavelength of the projection beam
the pressure within the projections lens holder
the mutual distances between the lens elements of the projection lens system
the composition of the medium in one or more the compartments of the projection lens holder
the temperature within the projection lens holder
the zero-setting of the alignment device
the zero-setting of the focusing device
the magnification of the projection lens system.

70. An apparatus as claimed in claim 16, characterized in that the reference plate is coupled via the production substrate table to a position detection device for detecting positions along at least two mutually perpendicular axes and rotations about said axes, and in that the signal outputs of said device, of the image detection device, of the alignment detection device and of a focus error detection device are connected to the inputs of an electronic signal processing device which supplies control signals for correcting one or more of the following parameters:
the wavelength of the projection beam
the pressure within the projection lens holder
the mutual distances between the lens elements of the projection lens system
the composition of the medium in one or more of the compartments of the projection lens holder
the temperature within the projection lens holder
the zero-setting of the alignment device
the zero-setting of the focusing device
the magnification of the projection lens system.

71. A projection apparatus as claimed in claim 70, in which the radiation source comprises a short-wave pulsed laser and a projection beam wavelength measuring device, characterized in that the output of said measuring device is connected to an input of the electronic signal processing device.

* * * * *